(12) United States Patent
Li et al.

(10) Patent No.: US 9,153,587 B2
(45) Date of Patent: Oct. 6, 2015

(54) FIN-TYPE SEMICONDUCTOR DEVICE

(71) Applicant: QUALCOMM Incorporated, San Diego, CA (US)

(72) Inventors: Xia Li, San Diego, CA (US); Bin Yang, San Diego, CA (US); Stanley Seungchul Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/659,893

(22) Filed: Mar. 17, 2015

(65) Prior Publication Data
US 2015/0187774 A1 Jul. 2, 2015

Related U.S. Application Data

(62) Division of application No. 13/834,594, filed on Mar. 15, 2013, now Pat. No. 8,999,792.

(51) Int. Cl.
*H01L 21/336* (2006.01)
*H01L 29/786* (2006.01)
(Continued)

(52) U.S. Cl.
CPC ........ *H01L 27/0924* (2013.01); *G06F 17/5068* (2013.01); *H01L 21/265* (2013.01); *H01L 21/823807* (2013.01); *H01L 21/823814* (2013.01); *H01L 21/823821* (2013.01); *H01L 21/823878* (2013.01); *H01L 29/0607* (2013.01);
(Continued)

(58) Field of Classification Search
CPC .................................................. H01L 27/0924
USPC ........... 438/282, 298, 142, 157; 257/349, 288
See application file for complete search history.

(56) References Cited

U.S. PATENT DOCUMENTS 5,869,858 A 2/1999 Ozawa et al.
6,333,532 B1 12/2001 Davari et al.
(Continued)

FOREIGN PATENT DOCUMENTS

EP 0510667 A1 10/1992
EP 1993136 A1 11/2008
(Continued)

OTHER PUBLICATIONS

International Search Report and Written Opinion for International Application No. PCT/US2014/024587, ISA/EPO, Date of Mailing Aug. 19, 2014, 22 pages.
(Continued)

*Primary Examiner* — Calvin Lee
(74) *Attorney, Agent, or Firm* — Toler Law Group, PC

(57) ABSTRACT

An apparatus comprises a substrate and a fin-type semiconductor device extending from the substrate. The fin-type semiconductor device comprises means for providing a first fin-type conduction channel having first and second regions, means for providing a second fin-type conduction channel having a fourth region above a third region, and means for shielding current leakage coupled to at least one of the first region and the third region. The first region has a first doping concentration greater than a second doping concentration of the second region. The first fin-type conduction channel comprises first ion implants implanted into the substrate at a first depth and second ion implants implanted into the substrate at a different depth. The third region has a third doping concentration, and the fourth region has a fourth doping concentration.

20 Claims, 13 Drawing Sheets

(51) Int. Cl.
*H01L 27/092* (2006.01)
*H01L 29/78* (2006.01)
*H01L 29/06* (2006.01)
*H01L 29/10* (2006.01)
*H01L 21/8238* (2006.01)
*H01L 21/265* (2006.01)
*G06F 17/50* (2006.01)

(52) U.S. Cl.
CPC ........ *H01L 29/1041* (2013.01); *H01L 29/7851* (2013.01)

(56) References Cited

U.S. PATENT DOCUMENTS

| | | | |
|---|---|---|---|
| 7,662,679 | B2 | 2/2010 | Izumida et al. |
| 7,781,273 | B2 | 8/2010 | Schepis et al. |
| 8,101,994 | B2 | 1/2012 | Yu et al. |
| 8,278,184 | B1 | 10/2012 | Chen et al. |
| 8,373,238 | B2 | 2/2013 | Lee et al. |
| 8,455,307 | B2 | 6/2013 | Cho |
| 8,999,792 | B2 * | 4/2015 | Li et al. .......................... 438/282 |
| 2002/0011612 | A1 | 1/2002 | Hieda |
| 2008/0121948 | A1 | 5/2008 | Kim et al. |
| 2010/0109086 | A1 | 5/2010 | Song et al. |
| 2010/0276756 | A1 | 11/2010 | Rachmady et al. |
| 2011/0042748 | A1 | 2/2011 | Anderson et al. |
| 2013/0154028 | A1 | 6/2013 | Wang et al. |
| 2014/0097487 | A1 | 4/2014 | Yen et al. |
| 2014/0264485 | A1 | 9/2014 | Li et al. |

FOREIGN PATENT DOCUMENTS

| | | |
|---|---|---|
| WO | 2006038164 A1 | 4/2006 |
| WO | 2011109510 A1 | 9/2011 |
| WO | 2013033956 A1 | 3/2013 |

OTHER PUBLICATIONS

Fried, D., et al., "Comparison Study of FinFETs: SOI vs. Bulk, Performance, Manufacturing Variability and Cost," SOI Industry Consortium, pp. 1-19.

Karl, E., et al., "A 4.6GHz 162Mb SRAM Design in 22nm Tri-Gate CMOS Technology with Integrated Active VMIN-Enhancing Assist Circuitry," 2012 IEEE International Solid-State Conference Digest of Technical Papers (ISSCC), IEEE, Piscateaway, NJ, pp. 230-232.

Lee, C.H. et al., "Novel Body tied FinFET cell array transistor DRAM with Negative Word Line Operation for Sub 60nm Technology and Beyond," Symposium on VLSI Technology, 2004, Digest of Technical Papers, Jun. 2004, IEEE, Piscataway, NJ, pp. 130-131.

Okano, K. et al, "Process Integration Technology and Device Characteristics of CMOS FinFET on Bulk Silicon Substrate with sub-10nm Fin Width and 20 nm Gate Length," IEEE International Electron Devices Meeting, 2005 IEDM Technical Digest, Dec. 2005, IEEE, Piscataway, NJ, 4 pages.

Partial International Search Report for International Application No. PCT/US2014/024587, ISA/EPO, Date of Mailing Jun. 13, 2014, 7 pages.

Shrivastava, M., et al., "A Novel Bottom Spacer FinFET Structure for Improved Short-Channel, Power-Delay, and Thermal Performance," IEEE Transactions on Electron Devices, Jun. 2010, vol. 57, No. 6, IEEE, Piscataway, NJ, pp. 1287-1294.

Takahashi, K, et al., "FinFETs with both large body factor and high drive-current," Semiconductor Device Research Symposium, 2007 International, Dec. 2007, IEEE, Piscataway, NJ, 2 pages.

Wu, C.C., et al., "High Performance 22/20nm FinFET CMOS Devices with Advanced High-K/Metal Gate Scheme," 2010 IEEE International Electron Devices Meeting (IEDM), Dec. 2010, IEEE, Piscataway, NJ, pp. 27.1.1-27.1.4.

* cited by examiner

FIN-TYPE SEMICONDUCTOR DEVICE

I. CROSS REFERENCE TO RELATED APPLICATIONS

The present application claims priority from and is a divisional application of U.S. patent application Ser. No. 13/834,594 filed Mar. 15, 2013, now U.S. Pat. No. 8,999,792 issued Apr. 7, 2015, entitled "FIN-TYPE SEMICONDUCTOR DEVICE," the content of which is incorporated by reference herein in its entirety.

II. FIELD

The present disclosure is generally related to fin-type semiconductor devices.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

An electronic device (e.g., a wireless phone or a computing device) may include a fin-type semiconductor device as a component. A fin-type semiconductor device is a semiconductor device that includes a plurality of gates and has narrow protruding "fins" formed into the semiconductor device. An example of a fin-type semiconductor device is a fin field-effect transistor (FinFET). A fin of a FinFET may be a fin-shaped semiconductor structure that enables formation of a conducting channel.

A digital logic circuit (e.g., a static random-access memory cell) may be constructed using at least one FinFET. To increase a drive current of the digital logic circuit, an additional FinFET may be added to the digital logic circuit. However, in existing FinFET fabrication processes, FinFETs of a particular size have the same fin height. An amount of drive current through a FinFET is determined by the fin height. Thus, a drive current ratio using FinFETs of the same size is digitized (e.g., an integer ratio). Digitized current ratios may reduce design options (as compared to a design with a non-integer ratio) of a resulting digital logic circuit.

Further, during the fabrication process, a fin height of the FinFET may be affected by variations in oxide layer height. Thus, two FinFETs may have different fin heights and the difference in the fin heights may not be controllable.

IV. SUMMARY

Fin field-effect transistors (FinFETs) of the same size and with non-controllable fin heights have a digitized current ratio. Digitized current ratios may reduce design options (as compared to a design with a non-integer ratio) of a resulting digital logic circuit. Systems and methods described herein may advantageously enable a fin height of a FinFET to be controlled during a fabrication process. Thus, FinFETs with controllable fin heights may have a non-integer current ratio.

For example, a semiconductor device may include a first fin and a second fin. The first fin may include a first region and a second region. The first region may have a higher doping concentration than the second region. The second fin may include a third region and a fourth region. The third region may have a higher doping concentration than the fourth region. The first region may be located at a first particular depth within the first fin and the third region may be located at a second particular depth within the second fin. The first particular depth may be different than the second particular depth.

The first fin may have a first effective fin height defined by a distance from the top of the first fin to an effective depth of the first region. The second fin may have a second effective fin height defined by a distance from the top of the second fin to an effective depth of the third region. The first effective fin height may be different than the second effective fin height. The first effective fin height and the second effective fin height may be controlled during fabrication of the semiconductor device.

During fabrication, first ion implants may be implanted into a substrate at a first particular depth of the substrate using a first implant energy level. After implantation of the first ion implants, the first region may be formed to include at least one of the first ion implants (e.g., via photolithography and etching). Second ion implants may be implanted into the substrate at a second particular depth using a second implant energy level. The third region may be formed to include at least one of the second ion implants. A difference in depth between the first particular depth and the second particular depth may correspond to a difference between the first effective fin height and the second effective fin height. The difference in depth may be controlled by a difference in implant energy level between the first implant energy level and the second implant energy level. In another particular embodiment, the first ion implants are implanted using a first implant dose and the second ion implants are implanted using a second implant dose. In another particular embodiment, the first ion implants are implanted using a first doping concentration and the second ion implants are implanted using a second doping concentration.

In a particular embodiment, the difference between the first effective fin height and the second effective fin height is controlled by a height difference between two regions of a pad oxide layer. During fabrication of the semiconductor device, a pad oxide layer may be formed on the substrate. The pad oxide layer may include a first oxide region and a second oxide region. A particular amount of oxide may be removed (e.g., etching) from the first oxide region so that the second oxide region is higher than the first oxide region. The first ion implants may be implanted through the first oxide region and into the substrate. The second ion implants may be implanted through the second oxide region and into the substrate.

When the first ion implants and the second ion implants are implanted using the same implant energy level, the difference in height between the first oxide region and the second oxide region may enable the first ion implants to be implanted at the first particular depth and the second ion implants to be implanted at the second particular depth. In another particular embodiment, instead of etching away oxide at the first oxide region, additional oxide is formed at the second oxide region so that the second oxide region is higher than the first oxide region.

In another particular embodiment, at least one of the first ion implants is implanted into the substrate (e.g., via lateral doping) to form the first region after an outer shape of the first fin is formed. At least one of the second ion implants is implanted into the substrate (e.g., via lateral doping) to form the third region after an outer shape of the second fin is formed. Additional ion implants may be implanted into the first region and/or the third region to adjust the difference between the first effective fin height and the second effective fin height.

In a particular embodiment, the difference between the first effective fin height and the second effective fin height is controlled by controlling a height difference between a high doping layer of a first fin and a high doping layer of a second fin. During fabrication, a pad oxide layer may be formed on the substrate. Regions of the pad oxide layer may be removed (e.g., etching) to expose areas for fin formation. A first high doping layer having a first height may be formed in one of the exposed areas via epitaxy. A first low doping layer may be formed via epitaxy over the first high doping layer to form a first particular fin. The first high doping layer may correspond to the first region of the first fin, and the first low doping layer may correspond to the second region of the first fin.

A second high doping layer having a second height may be formed in another exposed area via epitaxy. A second low doping layer may be formed via epitaxy over the second high doping layer to form a second particular fin. The second high doping layer may correspond to the third region of the second fin, and the second low doping layer may correspond to the fourth region of the second fin. A difference between the first height and the second height may correspond to the difference between the first effective fin height and the second effective fin height.

In a particular embodiment, a complementary metal-oxide semiconductor (CMOS) device is formed using FinFETs. An N-channel metal-oxide semiconductor (nMOS) transistor may be formed using one or more N-type FinFETs. A P-channel MOS (pMOS) transistor may be formed using one or more P-type FinFETs. During fabrication, P-type ion implants and N-type ion implants may be implanted into a substrate separately. The P-type and the N-type ion implants may be implanted at the same depth or at different depths. Regions of the substrate containing the P-type and the N-type ion implants may be trimmed (e.g., via photolithography and etching) to control an effective fin height. An epitaxial layer with lower doping concentration than the P-type ion implants and the N-type ion implants may be formed on the trimmed substrate. One or more N-type FinFETs and one or more P-type FinFETs may be formed (e.g., via photolithography, etching and film deposition). The one or more N-type FinFETs may include a portion of the epitaxial layer and at least one of the P-type ion implants. The one or more P-type FinFETs may include another portion of the epitaxial layer and at least one of the N-type ion implants.

In a particular embodiment, an apparatus comprises a substrate and a fin-type semiconductor device extending from the substrate. The fin type semiconductor device comprises a fin that comprises a first region having a first doping concentration and a second region having a second doping concentration. The first doping concentration is greater than the second doping concentration. The fin type semiconductor device also comprises an oxide layer. Prior to source and drain formation of the fin-type semiconductor device, a doping concentration of the oxide layer is less than the first doping concentration.

In a particular embodiment, a method comprises forming a fin that extends from a substrate. The fin comprises a first region having a first doping concentration and a second region having a second doping concentration. The first doping concentration is greater than the second doping concentration. The method also comprises forming an oxide layer on the substrate. Prior to source and drain formation of a fin-type semiconductor device that includes the fin, a doping concentration of the oxide layer is less than the first doping concentration.

One particular advantage provided by at least one of the disclosed embodiments is an ability to control an effective fin height of a FinFET during fabrication. Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

Figure 10:
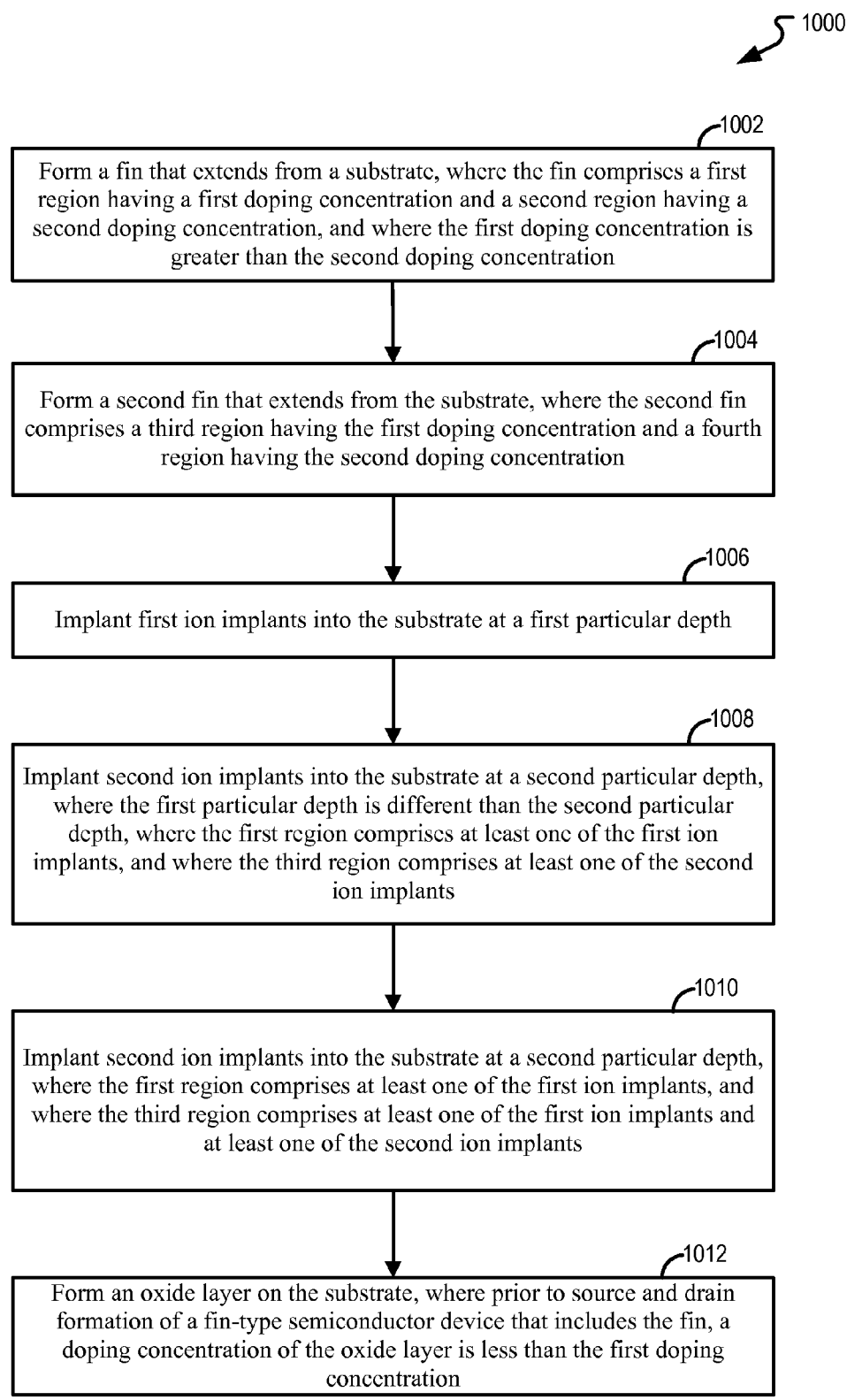
Figure 11:
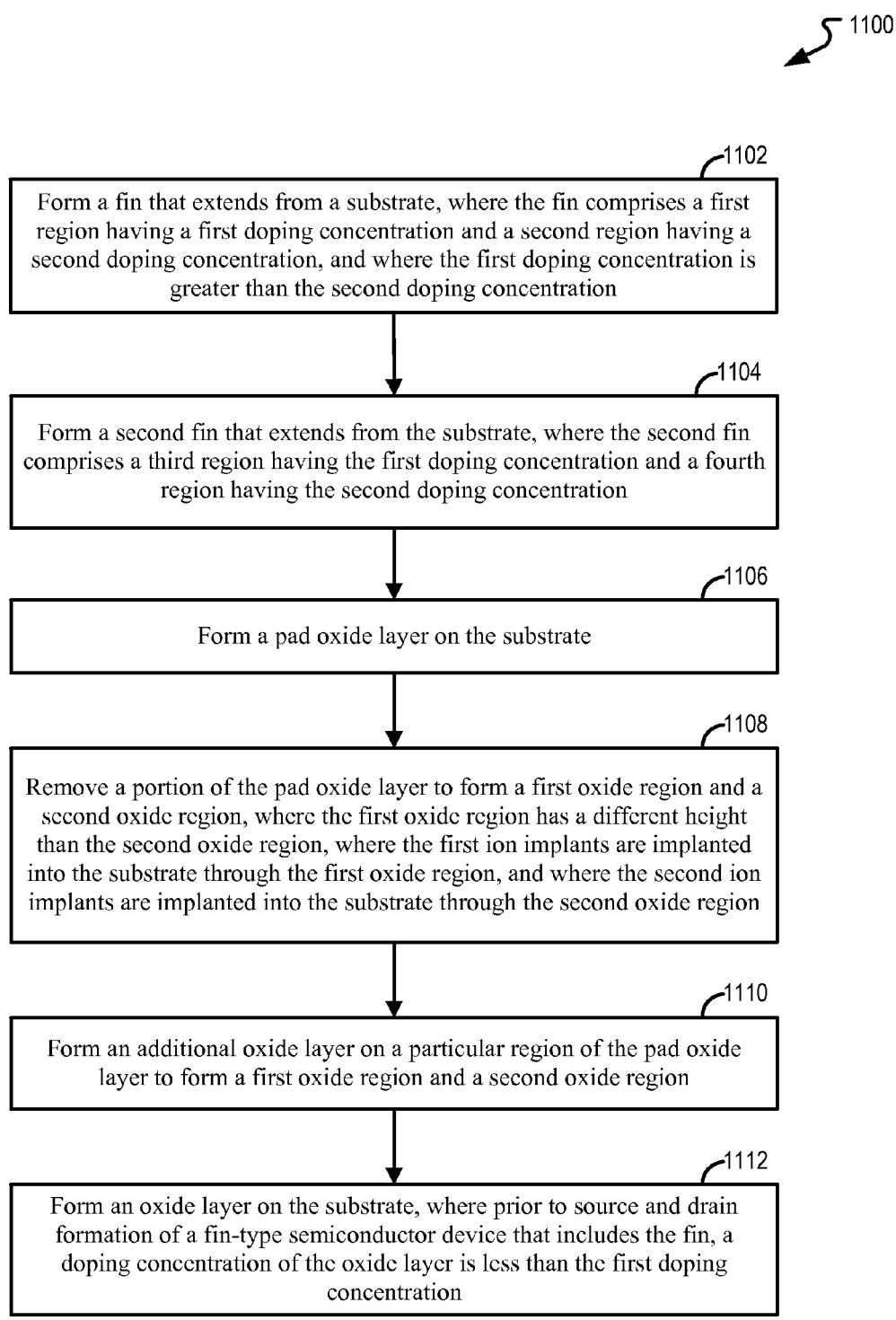
Figure 12:
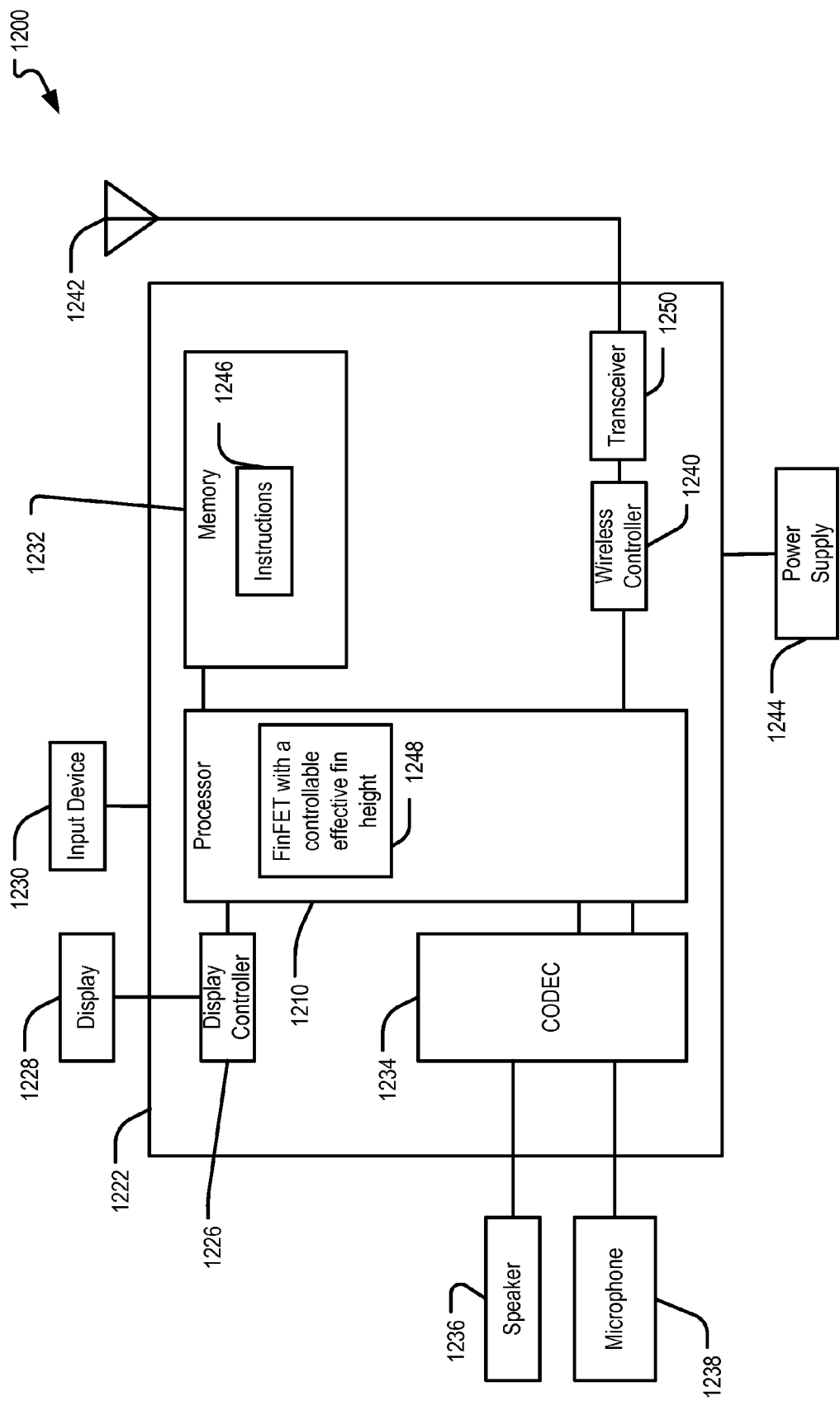
Figure 13:
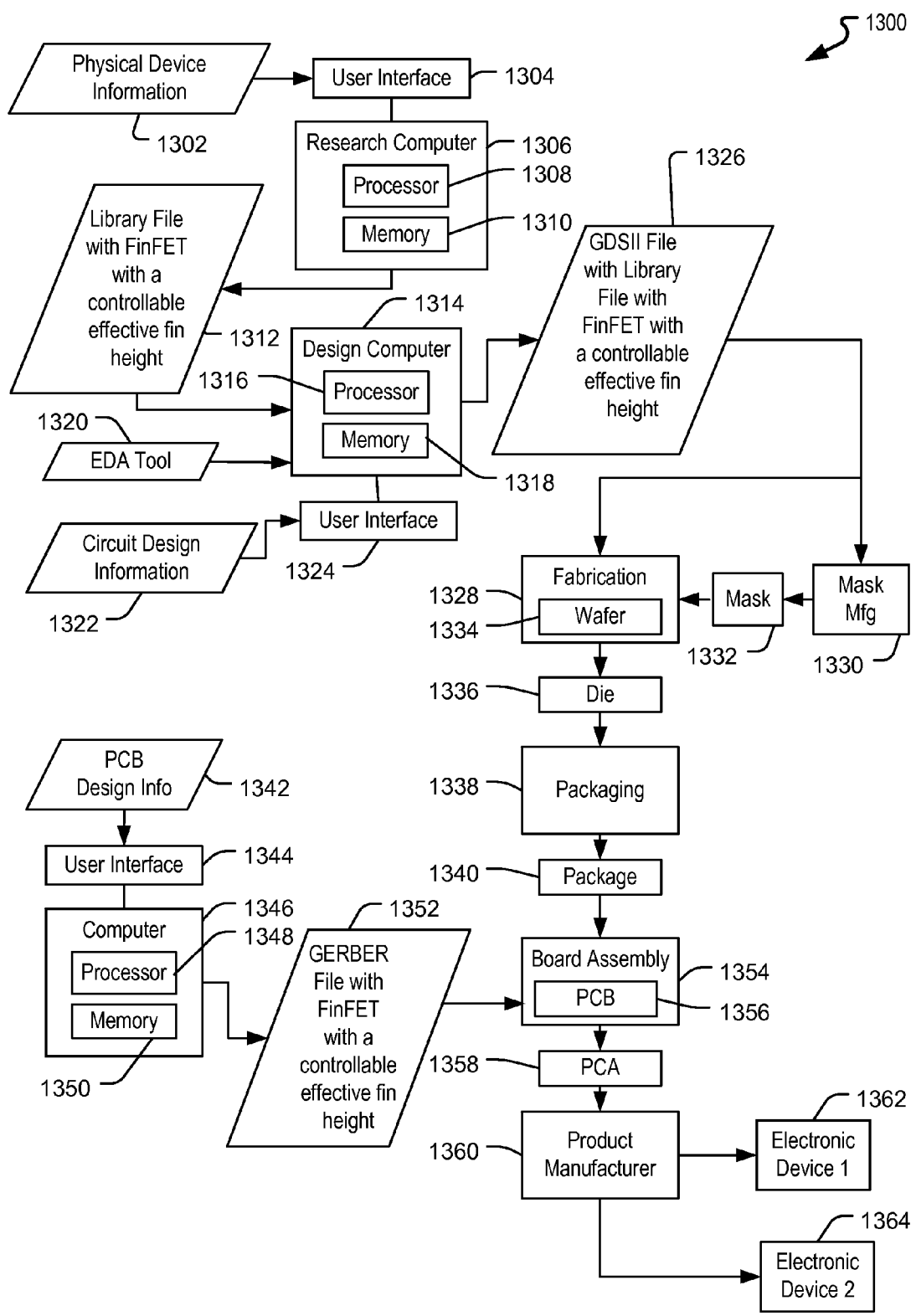

FIG. 10 a flowchart that illustrates a particular embodiment of a method of manufacturing a fin-type semiconductor device that includes a FinFET with fins having different effective fin heights;

FIG. 11 a flowchart that illustrates another particular embodiment of a method of manufacturing a fin-type semiconductor device that includes a FinFET with fins having different effective fin heights;

FIG. 12 is a diagram of a particular embodiment of a communication device that includes a FinFET with fins having different effective fin heights; and FIG. 13 is a data flow diagram that illustrates a particular illustrative embodiment of a process to manufacture electronic devices that include a FinFET with fins having effective fin heights.

VI. DETAILED DESCRIPTION

Figure 1:
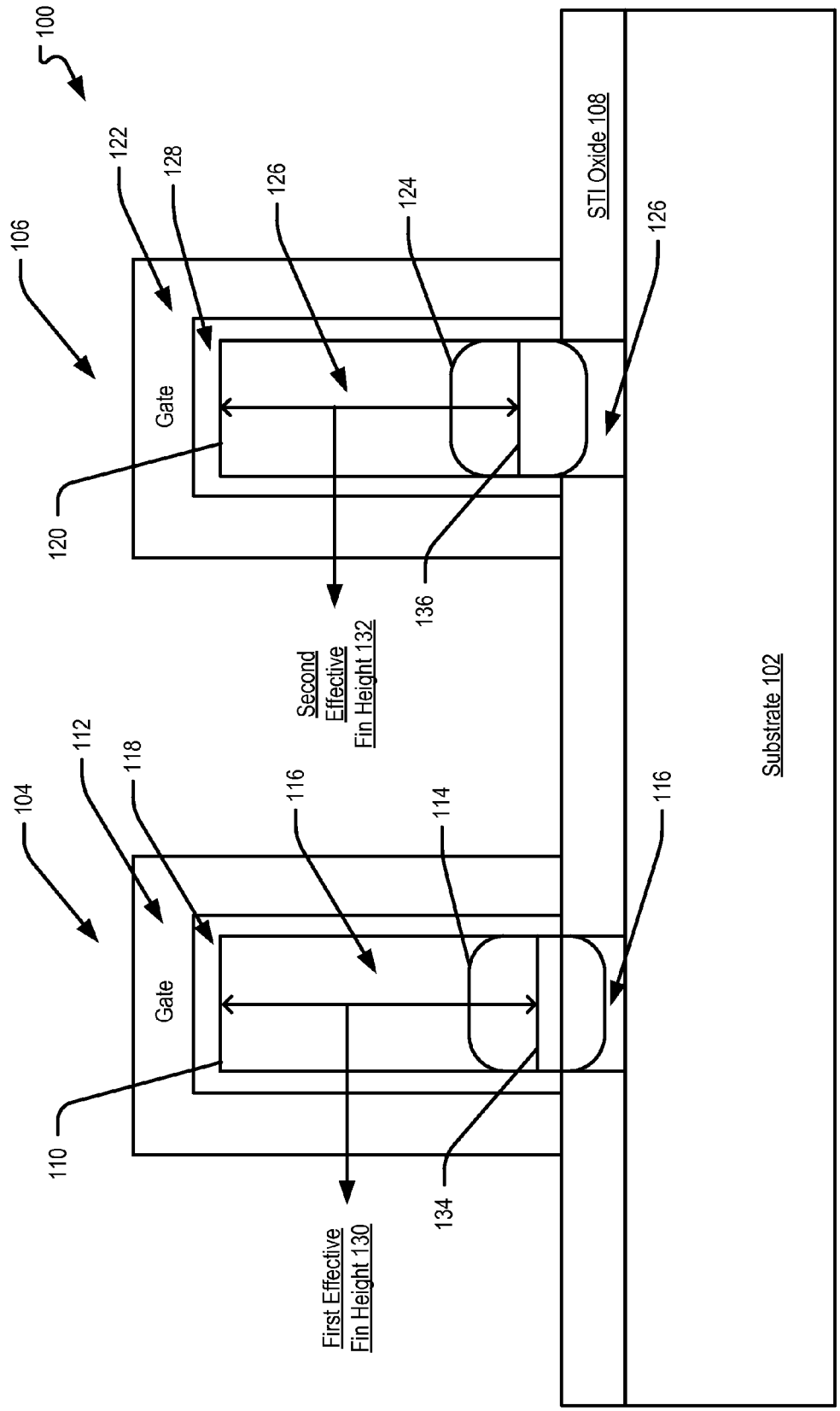
FIG. 1 is a diagram of a particular embodiment of a fin-type semiconductor device that includes a Fin field-effect transistor (FinFET) with fins having different effective fin heights.

FIG. 1 illustrates a particular embodiment of a fin-type semiconductor device 100 that includes a Fin field-effect transistor (FinFET) with fins having different effective fin heights. The fin-type semiconductor device 100 has a substrate 102. The substrate 102 may be a silicon substrate with a well (not shown). The fin-type semiconductor device 100 may have a first FinFET 104 and a second FinFET 106 extending from the substrate 102. The fin-type semiconductor device 100 may also include a shallow trench isolation (STI) oxide layer 108 that surrounds the first FinFET 104 and the second FinFET 106. The fin-type semiconductor device 100 may further include a source (not shown) and a drain (not shown).

The first FinFET 104 may include a first fin 110 and a first gate 112. The first fin 110 may include a first region 114 having a first effective depth (as indicated at 134) and a second region 116. The second region 116 may include regions of the first fin 110 other than the first region 114 (e.g., a remainder region of the first fin 110). The first region 114 may have a first doping concentration, and the second region 116 may have a second doping concentration. The first doping concentration may be higher than the second doping concentration. A first gate dielectric layer 118 may be disposed between the first fin 110 and the first gate 112. The second FinFET 106 may include a second fin 120 and a second gate 122. The second fin 120 may include a third region 124 having a second effective depth (as indicated at 136) and a fourth region 126. The fourth region 126 may include regions of the second fin 120 other than the third region 124 (e.g., a remainder region of the second fin 120). The third region 124 may have a higher doping concentration than the fourth region 126. A second gate dielectric layer 128 may be disposed between the second fin 120 and the second gate 122. The first gate dielectric layer 118 and the second gate dielectric layer 128 may be different from the STI oxide layer 108 (e.g., high-k dielectric gate film, etc.). The STI oxide layer 108 may be in physical contact with the first fin 110 and/or the second fin 120 to shield current leakage between the first FinFET 104 and the second FinFET 106. The third region 124 and the first region 114 may have the same doping concentration but different depths. The fourth region 126 and the second region 116 may have the same doping concentration.

The first region 114 may be located at a first particular depth within the first fin 110 and the third region 124 may be located at a second particular depth within the second fin 120. The first particular depth may be different than the second particular depth. The first fin 110 may have a first effective fin height 130 defined by a distance from the top of the first fin 110 to the first effective depth of the first region 114 (as indicated by an arrow in FIG. 1). The second fin 120 may have a second effective fin height 132 defined by a distance from the top of the second fin 120 to the second effective depth of the third region 124 (as indicated by an arrow in FIG. 1). In a particular embodiment, the first effective height is different than the second effective height. The first effective fin height 130 is related to an effective channel width of the first FinFET 104. The effective channel width of the first FinFET 104 may determine an amount of current flow through the first FinFET 104. Thus, by controlling the first effective fin height 130 during fabrication of the first FinFET 104, the effective channel width of the first FinFET 104 may be controlled. Similarly, the second effective fin height 132 is related to an effective channel width of the second FinFET 106. The effective channel width of the second FinFET 106 may be controlled by controlling the second effective fin height 132 during fabrication of the second FinFET 106.

By controlling the first particular depth and/or the second particular depth to vary the first effective height 130 and/or the second effective height 132 during fabrication, drive current of the first FinFET 104 and the second FinFET 106 may be adjusted. For example, a particular drive current ratio between the first FinFET 104 and the second FinFET 106 may be obtained to suit a design parameter of the fin-type semiconductor device 100. The ability to obtain a particular drive current to suit a design requirement may reduce design complexity or may increase design flexibility of a semiconductor device.

A drive current ratio between the first FinFET 104 and the second FinFET 106 may be defined by:

$$I\_FinFET1/I\_FinFET2=(\mu1/\mu2)*(n1/n2)*(1+2\Delta Fin\_H\_eff/(2*Fin\_H\_eff2+Fin\_W))$$

where I_FinFET1 is a drive current of the first FinFET 104, I_FinFET2 is a drive current of the second FinFET 106, μ1 is the electron mobility of the first FinFET 104, μ2 is the electron mobility of the second FinFET 106, n1 is a number of fins of the first FinFET 104, n2 is a number of fins of the second FinFET 106, ΔFin_H_eff is the effective height difference between the first FinFET 104 and the second FinFET 106, Fin_H_eff2 is the second effective fin height 132 of the second FinFET 106, and Fin_W is the width of the first FinFET 104 and the second FinFet 106.

In a particular embodiment, the first region 114 includes ion implants that are implanted into the substrate 102 at the first particular depth using a first implant energy level during fabrication and the third region 124 includes ion implants that are implanted into the substrate 102 at the second particular depth using a second implant energy level during fabrication. A difference in depth between the first particular depth and the second particular depth may be controlled by a difference in energy level between the first implant energy level and the second implant energy level. For example, Indium (In) or Antimony (Sb) implants may be used for a FinFET (e.g., the first FinFET 104 or the second FinFET 106). The FinFET may be an N-type FinFET or a P-type FinFET. At an implant energy level of In 75 keV or Sb 75 keV, a depth (e.g., the first effective depth) of 34 nanometer (nm) to 35 nm may be achieved. At an implant energy level of In 65 keV or Sb 45 keV, a depth (e.g., the second effective depth) of 28 nm to 31 nm may be achieved.

In another particular embodiment, the first region 114 includes ion implants that are implanted into the substrate 102 at the first particular depth using a first implant dose and the third region 124 includes ion implants that are implanted into the substrate 102 at the second particular depth using a second implant dose. A difference in depth between the first particular depth and the second particular depth may be controlled by a difference in dosage between the first dose and the second dose. Thus, the fin-type semiconductor device 100 may provide a non-integer drive current ratio to suite a design parameter of a resulting semiconductor device.

Figure 2:
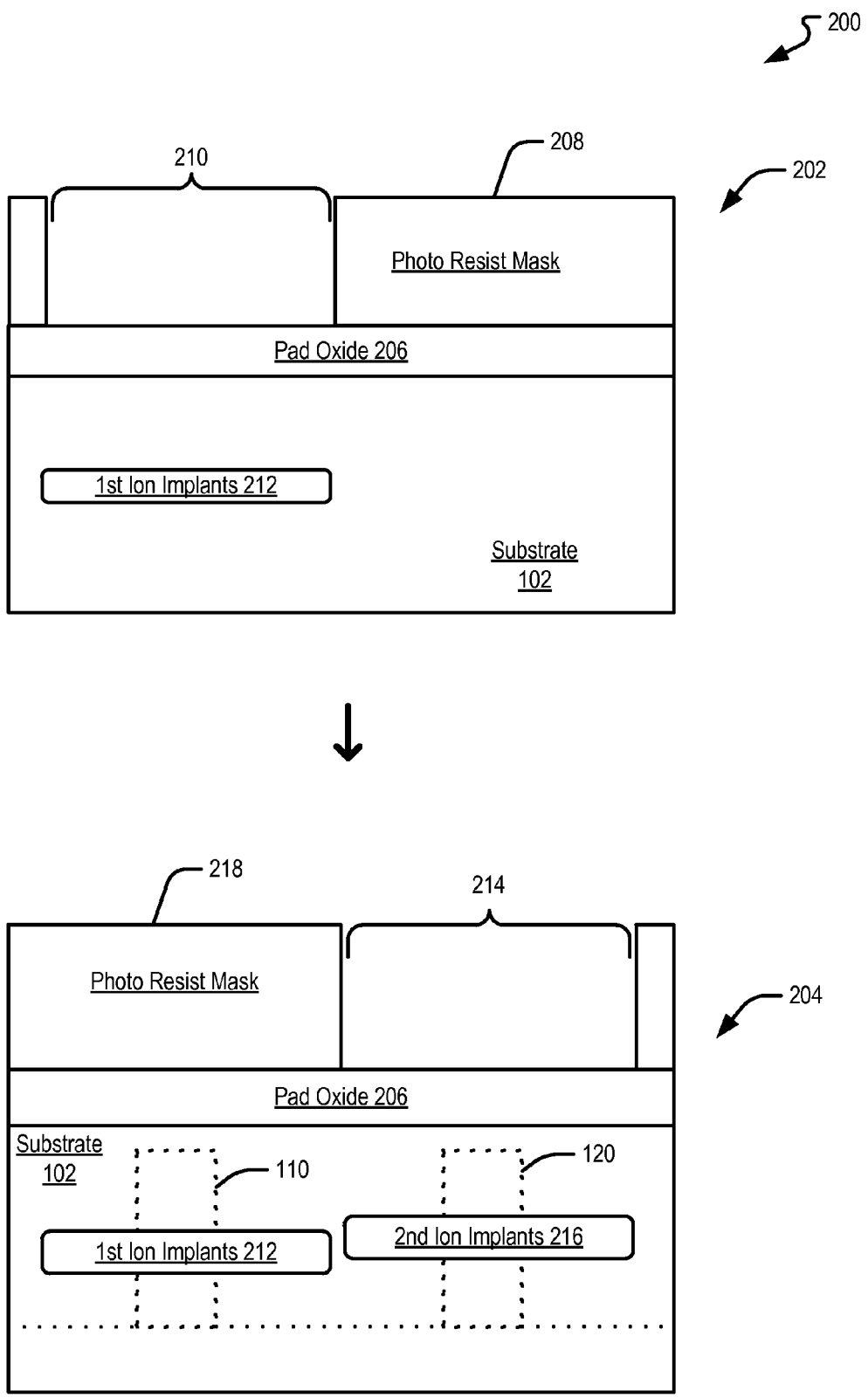
FIG. 2 is a diagram that illustrates a particular embodiment of a portion of a process to manufacture a fin-type semiconductor device that includes a FinFET with fins having different effective fin heights.
Figure 3:
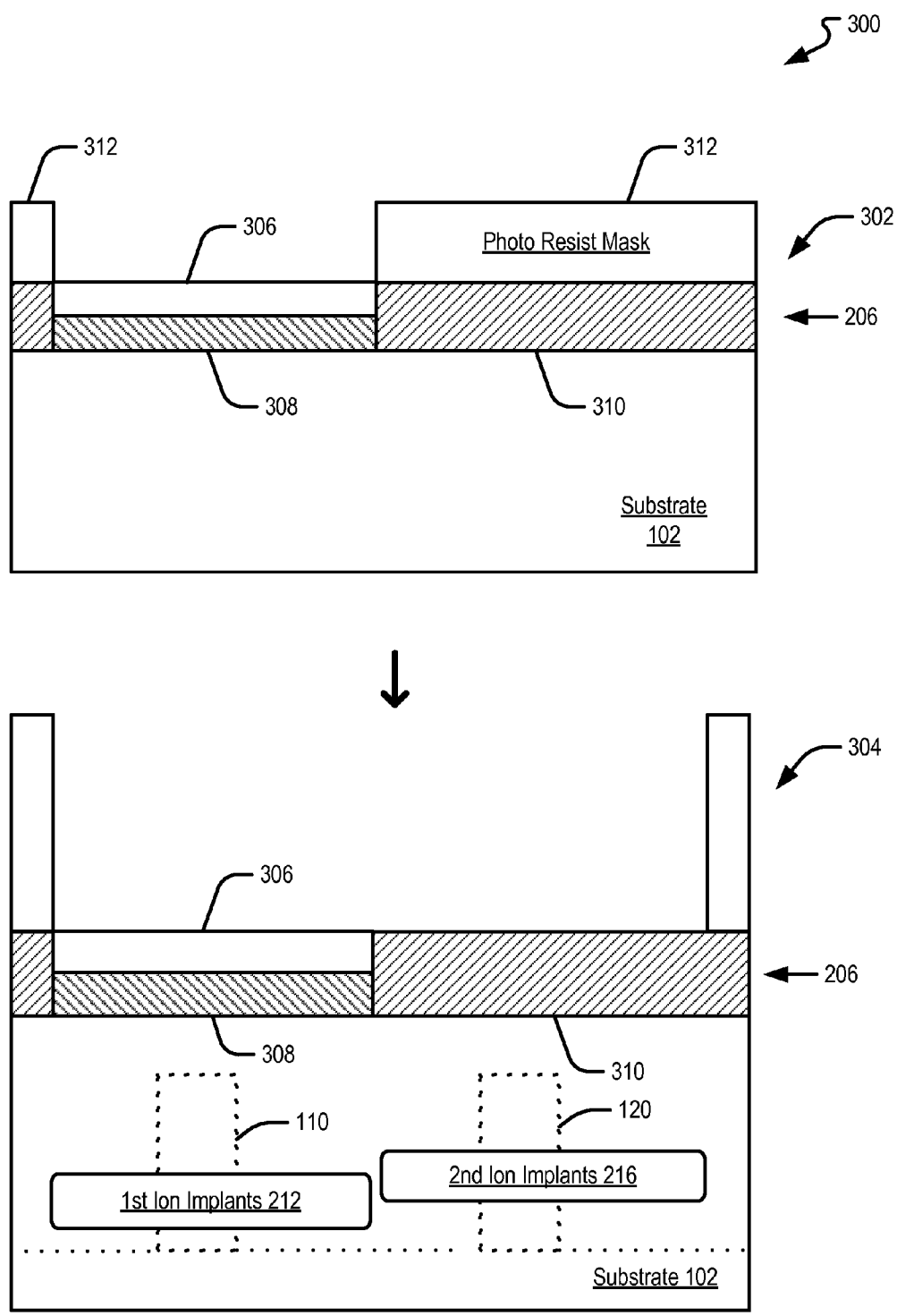
FIG. 3 is a diagram that illustrates another particular embodiment of a portion of a process to manufacture a fin-type semiconductor device that includes a FinFET with fins having different effective fin heights.
Figure 4:
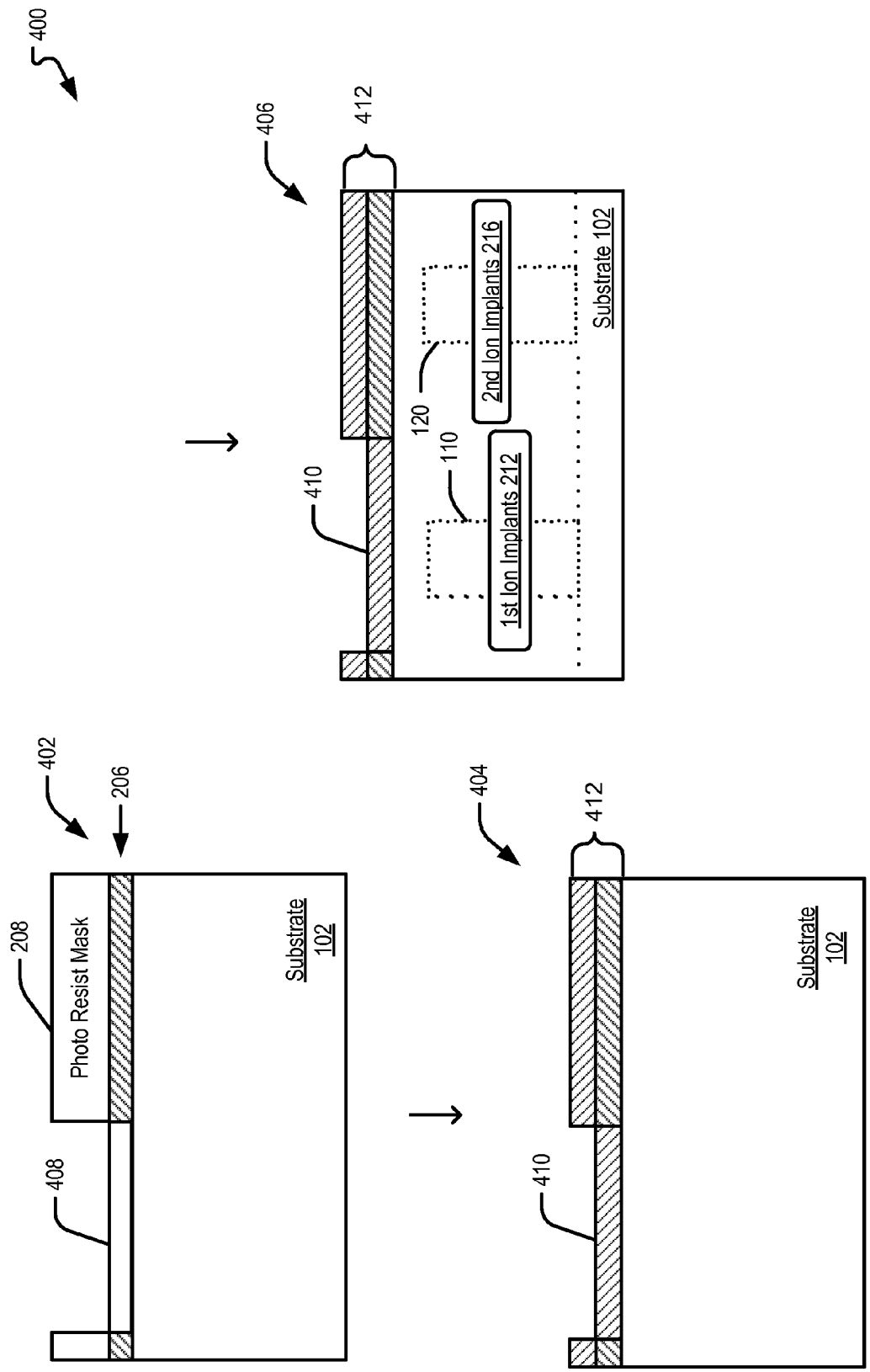
FIG. 4 is a diagram that illustrates another particular embodiment of a portion of a process to manufacture a fin-type semiconductor device that includes a FinFET with fins having different effective fin heights.

FIGS. 2-4 illustrate alternative embodiments of a portion of a process to manufacture a fin-type semiconductor device that includes a FinFET with fins having different effective fin heights. In particular, FIG. 2 illustrates a method of controlling ion implant depths using different implant energy levels during manufacturing of the fin-type semiconductor device.

FIG. 3 illustrates a method of controlling ion implant depths by reducing a height of a particular region in a pad oxide layer during manufacturing of the fin-type semiconductor device. FIG. 4 illustrates a method of controlling ion implant depths by increasing a height of a particular region in a pad oxide layer during manufacturing of the fin-type semiconductor device.

FIG. 2 illustrates a particular embodiment of a portion of a process 200 to manufacture a fin-type semiconductor device that includes a FinFET with fins having different effective fin heights. At a first processing stage 202, a pad oxide layer 206 may be formed on the surface of the substrate 102. A first photo resist mask 208 may be formed on a first partial surface of the pad oxide layer 206 such that a first area 210 is exposed. First ion implants 212 are implanted through the pad oxide layer 206 and into the substrate 102 through the first area 210. The first ion implants 212 may be implanted into the substrate 102 at the first particular depth using the first implant energy level.

At a second processing stage 204, a second photo resist mask 218 may be formed on a second partial surface of the pad oxide layer 206 such that a second area 214 is exposed. The second ion implants 216 may be implanted through the pad oxide layer 206 and into the substrate 102 through the second area 214. The second ion implants may be implanted at the second particular depth using the second implant energy level. The first implant energy level may be different from the second implant energy level. After the first ion implants 212 and the second ion implants 216 are implanted, the pad oxide layer 206 may be removed (e.g., using wet or dry etching) and the first FinFET 104 and the second FinFET 106 may be formed from the substrate 102 such that at least one of the first ion implants 212 forms the first region 114 and at least one of the second ion implants 216 forms the third region 124 (e.g., by photolithography and etching to expose the first fin 110 and the second fin 120 of FIG. 1). After formation of the first fin 110 and the second fin 120, the STI oxide layer 108, the first gate dielectric layer 118, the second gate dielectric layer 128, the first gate 112, the second gate 122, the source (not shown), and the drain (not shown) may also be formed (e.g., via dielectric deposition, film deposition, photolithography, and etching) to form the fin-type semiconductor device 100 of FIG. 1.

Because the STI oxide layer 108 is formed after fin formation, the STI oxide layer 108 may not be subject to ion implantation, such as the ion implantation at the first region 114 or the third region 124. Accordingly, the STI oxide layer 108 may be substantially devoid of ion implants (e.g., the first ion implants 212 or the second ion implants 216). Prior to source and drain formation of the fin-type semi-conductor device 100, the STI oxide layer 108 may have a doping concentration that is less than the first doping concentration ($10^{16}$~$10^{18}$/cm$^3$). During the source and drain formation, the surface (50~100 angstrom) of the STI oxide layer 108 may be doped.

Thus, a difference in effective fin height between a FinFET (e.g., the first FinFET 104) and another FinFET (e.g., the second FinFET 106) may be controlled by a difference in energy level between the first implant energy level and the second implant energy level. Alternatively, instead of using different levels of implant energy, the difference in ion implant depth may be controlled by a difference in doping concentration between the first ion implants 212 and the second ion implants 216.

FIG. 3 illustrates another particular embodiment of a portion of a process 300 to manufacture a fin-type semiconductor device that includes a FinFET with fins having different effective fin heights. The process 300 may control a difference in effective fin height between a FinFET and another FinFET using a difference in height between two regions of a pad oxide layer.

At a first processing stage 302, after the pad oxide layer 206 of FIG. 2 is formed, a portion 306 of the pad oxide layer 206 may be removed (e.g., using dry or wet etching) to expose a first oxide region 308 that is thinner than a second oxide region 310. At a second processing stage 304, when the first ion implants 212 and the second ion implants 216 are implanted, the first ion implants 212 may be implanted through the first oxide region 308 and into the substrate 102 of FIG. 1. The second ion implants 216 may be implanted through the second oxide region 310 and into the substrate 102. When the first ion implants 212 and the second ion implants 216 are implanted according the same level of implant energy, the difference in height between the first oxide region 308 and the second oxide region 310 may enable the first ion implants 212 to be implanted at the first particular depth and the second ion implants 216 to be implanted at the second particular depth. The difference in height may enable the first oxide region 308 to absorb less implant energy than the second oxide region 310. The STI oxide layer 108, the first gate dielectric layer 118, the second gate dielectric layer 128, the first gate 112, the second gate 122, the source (not shown), and the drain (not shown) may also be formed (e.g., via dielectric deposition, film deposition, photolithography, and etching) to form the fin-type semiconductor device 100 of FIG. 1.

The difference in ion implant depth may be controlled by a difference in height between the first oxide region 308 and the second oxide region 310. To further adjust the difference in ion implant depth between the first particular depth and the second particular depth, the first ion implants 212 and the second ion implants 216 may be implanted using different implant energy levels through masks.

FIG. 4 illustrates another particular embodiment of a portion of a process 400 to manufacture a fin-type semiconductor device that includes a FinFET with fins having different effective fin heights. The process 400 may increase the height of an oxide region of a pad oxide layer to control a difference in height between two regions of a pad oxide layer.

At a first processing stage 402, a region 408 of the pad oxide layer 206 of FIG. 2 may be removed (e.g., using wet or dry etching) such that the surface of the substrate 102 is exposed. At a second processing stage 404, an additional layer of pad oxide may be formed on the surface of the substrate 102 and over the pad oxide layer 206 such that a second pass-through region 412 has a greater height than a first pass-through region 410.

At a third processing stage 406, when the first ion implants 212 and the second ion implants 216 are implanted, the first ion implants 212 may be implanted through the first pass-through region 410 and into the substrate 102. The second ion implants 216 may be implanted through the second pass-through region 412 and into the substrate 102. When the first ion implants 212 and the second ion implants 216 are implanted using the same level of implant energy, the difference in height between the first pass-through region 410 and the second pass-through region 412 may enable the first ion implants 212 to be implanted at the first particular depth and the second ion implants 216 to be implanted at the second particular depth. To further adjust the difference in ion implant depth, the first ion implants 212 and the second ion implants 216 may be implanted using different implant energy levels through masks. The STI oxide layer 108, the first gate dielectric layer 118, the second gate dielectric layer 128, the first gate 112, the second gate 122, the source (not shown), and the drain (not shown) may also be formed (e.g., via dielectric deposition, film deposition, photolithography, and etching) to form the fin-type semiconductor device 100 of FIG. 1.

Figure 5:
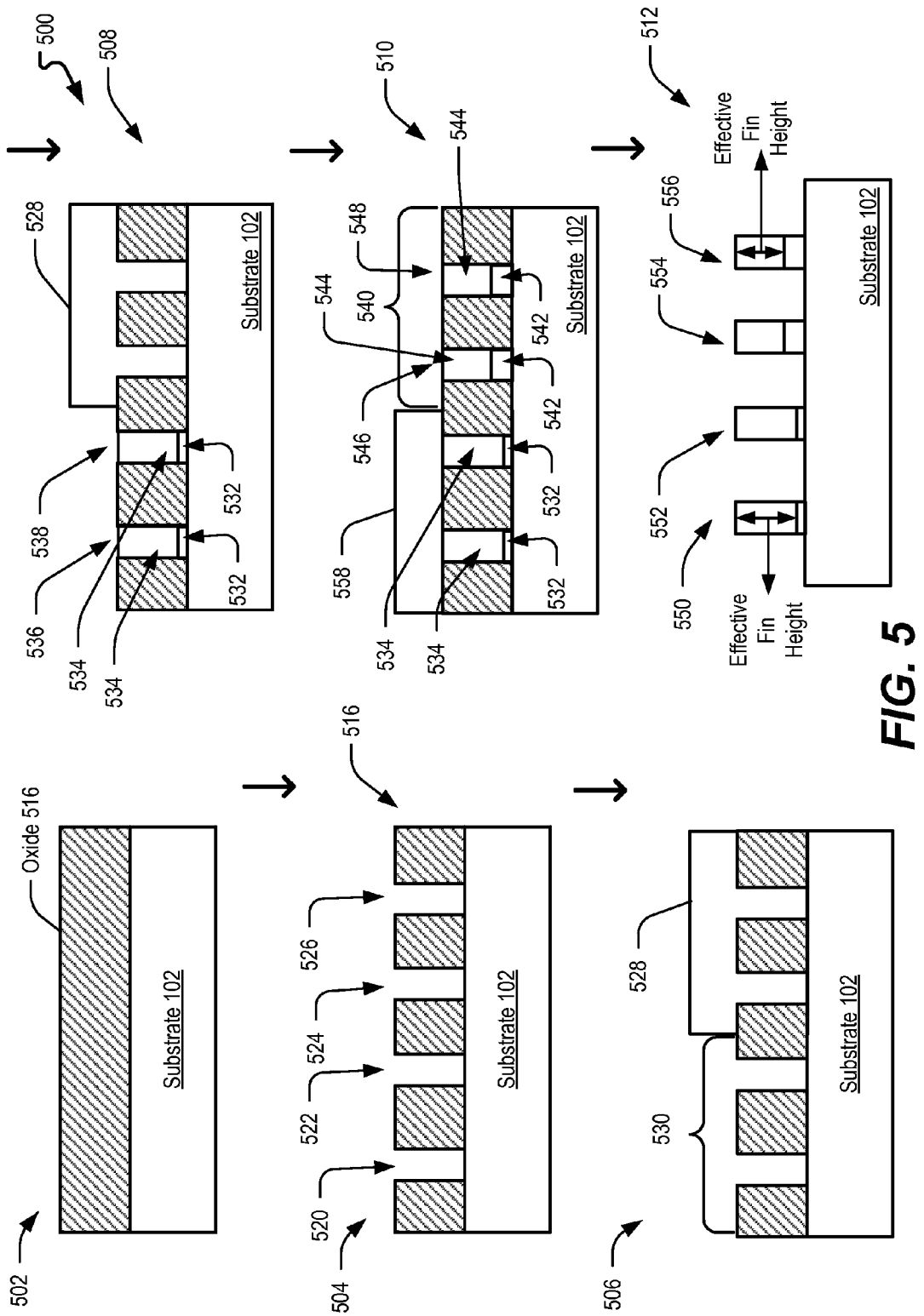
FIG. 5 is a diagram that illustrates a particular embodiment of a process to manufacture a fin-type semiconductor device that includes a FinFET with fins having different effective fin heights.

FIG. 5 illustrates another particular embodiment of a process 500 to manufacture a fin-type semiconductor device that includes a FinFET with fins having different effective fin heights. The process 500 may be used to manufacture the fin-type semiconductor device 100 of FIG. 1. The process 500 may control a difference in effective fin height between a FinFET and another FinFET via epitaxy.

At a first processing stage 502, an oxide layer 516 may be formed on the surface of the substrate 102 of FIG. 1. At a second processing stage 504, regions of the oxide layer 516 may be removed (e.g., using photolithography or etching) such that areas 520, 522, 524, and 526 are exposed. At a third processing stage 506, a first dummy mask 528 may be formed over the oxide layer 516 and the substrate 102 such that a first area 530 that includes the areas 520 and 522 is exposed. At a fourth processing stage 508, a first high doping layer 532 may be formed via epitaxy in the areas 520 and 522. The first high doping layer 532 may have a first height. A first low doping layer 534 may be formed via epitaxy over the first high doping layer 532 to form a first particular fin 536. A second particular fin 538 may be formed in the area 522 using the first high doping layer 532 and the first low doping layer 534. The first high doping layer 532 may have a higher doping concentration than the first low doping layer 534. The first high doping layer 532 may be doped with an N-type dopant or a P-type dopant.

At a fifth processing stage 510, a second dummy mask 558 may be formed over the oxide layer 516 and the substrate 102 to expose a second area 540. A second high doping layer 542 may be formed via epitaxy in the areas 524 and 526. The second high doping layer 542 may have a second height. The second height may have a different height than the first height of the first high doping layer 532. A second low doping layer 544 may be formed via epitaxy in the area 524 over the second high doping layer 542 to form a third particular fin 546. A fourth particular fin 548 may be formed in the area 526 using the second high doping layer 542 and the second low doping layer 544. The second high doping layer 542 may be doped with the N-type dopant or the P-type dopant.

At a sixth processing stage 512, a first particular FinFET 550 that includes the first particular fin 536, a second particular FinFET 552 that includes the second particular fin 538, a third particular FinFET 554 that includes the third particular fin 546, and a fourth particular FinFET 556 that includes the fourth particular fin 548 may be formed by adding a gate (not shown), a source (not shown), and a drain (not shown) to each particular fin 536, 538, 546, 548 (e.g., via dielectric deposition and film deposition) and by etching away a particular amount of the oxide layer 516. The first particular FinFET 550 and the second particular FinFET 552 may have the same effective fin height (as indicated by an arrow in FIG. 5) that corresponds to the first effective fin height 130 of FIG. 1. The third particular FinFET 554 and the fourth particular FinFET 556 may have the same effective fin height (as indicated by an arrow in FIG. 5) that corresponds to the second effective fin height 132 of FIG. 1. The first particular FinFET 550, the second particular FinFET 552, the third particular FinFET 554, the fourth particular FinFET 556, or any combination thereof may form a fin-type semiconductor device. The fin-type semiconductor device may be the fin-type semiconductor device 100 of FIG. 1.

Figure 6:
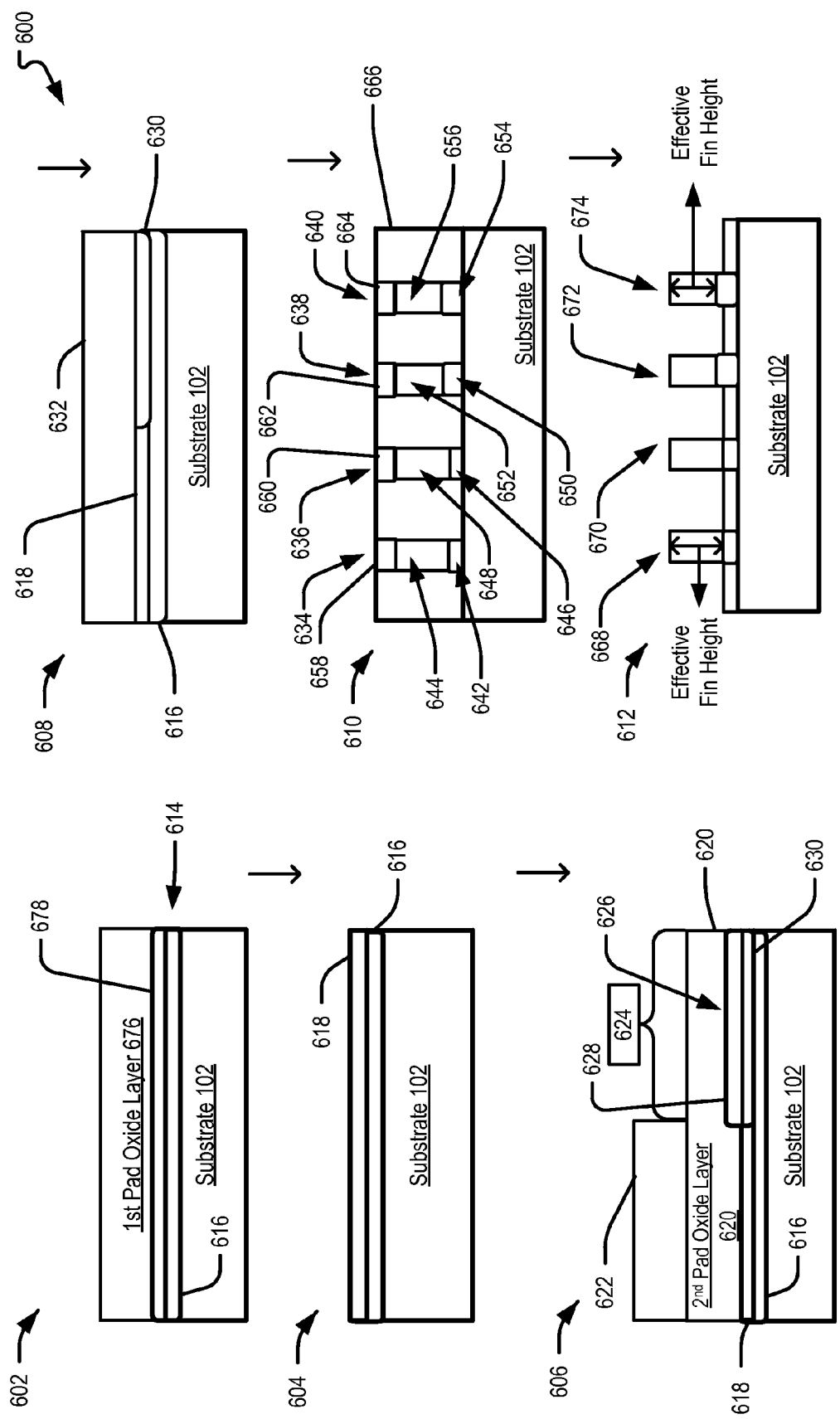
FIG. 6 is a diagram that illustrates another particular embodiment of a process to manufacture a fin-type semiconductor device that includes a FinFET with fins having different effective fin heights.

FIG. 6 illustrates another particular embodiment of a process 600 to manufacture a fin-type semiconductor device that includes a FinFET with fins having different effective fin heights. The process 600 may use overlapping ion implants to control a difference in effective fin height between a FinFET and another FinFET.

At a first processing stage 602, a first pad oxide layer 676 may be formed on the surface of the substrate 102 of FIG. 1. After formation of the first pad oxide layer 676, ion implants 614 may be implanted into the first pad oxide layer 676 and into the substrate 102. The ion implants 614 may be implanted at a first depth such that at least one of the ion implants 614 is implanted into a region 678 of the first pad oxide layer 676 and at least one of the ion implants 614 is implanted into a region 616 of the substrate 102. At a second processing stage 604, the first pad oxide layer 676 including the region 678 may be removed (e.g., using wet or dry etching). A first epitaxial layer 618 may be formed on the surface of the substrate 102. The region 616 may have a higher doping concentration than the first epitaxial layer 618.

At a third processing stage 606, a second pad oxide layer 620 may be formed on the surface of the first epitaxial layer 618. A photo resist mask 622 may be formed over the second pad oxide layer 620 such that a pass-through region 624 is exposed. Additional ion implants 626 may be implanted at a second depth such that at least one of the additional ion implants 626 is implanted into a region 628 of the second pad oxide layer 620 and at least one of the additional ion implants 626 is implanted into a region 630 of the first epitaxial layer 618. The additional ion implants 626 may have the same doping concentration as the ion implants 614. The region 630 may overlap with a portion of the region 616.

At a fourth processing stage 608, the photo resist mask 622, the second pad oxide layer 620 including the region 628 may be removed (e.g., using wet or dry etching). A second epitaxial layer 632 may be formed on the surface of the substrate 102. The second epitaxial layer 632 may have the same doping concentration as the first epitaxial layer 618.

At a fifth processing stage 610, a first particular fin 634, a second particular fin 636, a third particular fin 638, and a fourth particular fin 640 may be formed (e.g., via photolithography and etching). The first particular fin 634 may include a first high doping region 642 and a first low doping region 644. The first high doping region 642 may include a portion of the region 616. The first low doping region 644 may include at least a portion of the first epitaxial layer 618 and at least a portion of the second epitaxial layer 632. The second particular fin 636 may include a second high doping region 646 and a second low doping region 648. The second high doping region 646 may include at least a portion of the region 616. The second low doping region 648 may include at least a portion of the first epitaxial layer 618 and at least a portion of the second epitaxial layer 632. The first high doping region 642 and the second high doping region 646 may have a first height.

The third particular fin 638 may include a third high doping region 650 and a third low doping region 652. The third high doping region 650 may include at least a portion of the region 616 and at least a portion of the region 630. The third low doping region 652 may include at least a portion of the second epitaxial layer 632. The fourth particular fin 640 may include a fourth high doping region 654 and a fourth low doping region 656. The fourth high doping region 654 may include at least a portion of the region 616 and at least a portion of the region 630. The fourth low doping region 656 may include at least a portion of the second epitaxial layer 632. The third high doping region 650 and the fourth high doping region 654 may have a second height that is different than the first height. A STI hard mask 658, 660, 662, 664 may be formed on the top surface of each particular fin 634-640, respectively. A STI oxide layer 666 may be formed on regions of the surface of the substrate 102 that are not occupied by the particular fins 634-640.

At a sixth processing stage 612, a first particular FinFET 668 that includes the first particular fin 634, a second particular FinFET 670 that includes the second particular fin 636, a third particular FinFET 672 that includes the third particular fin 638, and a fourth particular FinFET 674 that includes the fourth particular fin 640 may be formed by adding a gate (not shown), a source (not shown), and a drain (not shown) to each particular fin 634-640 (e.g., via dielectric deposition and film deposition) and by etching away a particular amount of the oxide layer 666. The first particular FinFET 668 and the second particular FinFET 670 may have the same effective fin height (as indicated by an arrow in FIG. 6) that corresponds to the first effective fin height 130 of FIG. 1. The third particular FinFET 672 and the fourth particular FinFET 674 may have the same effective fin height (as indicated by an arrow in FIG. 6) that corresponds to the second effective fin height 132 of FIG. 1. The first particular FinFET 668, the second particular FinFET 670, the third particular FinFET 672, the fourth particular FinFET 674, or any combination thereof may form a fin-type semiconductor device. The fin-type semiconductor device may be the fin-type semiconductor device 100 of FIG. 1.

Figure 7:
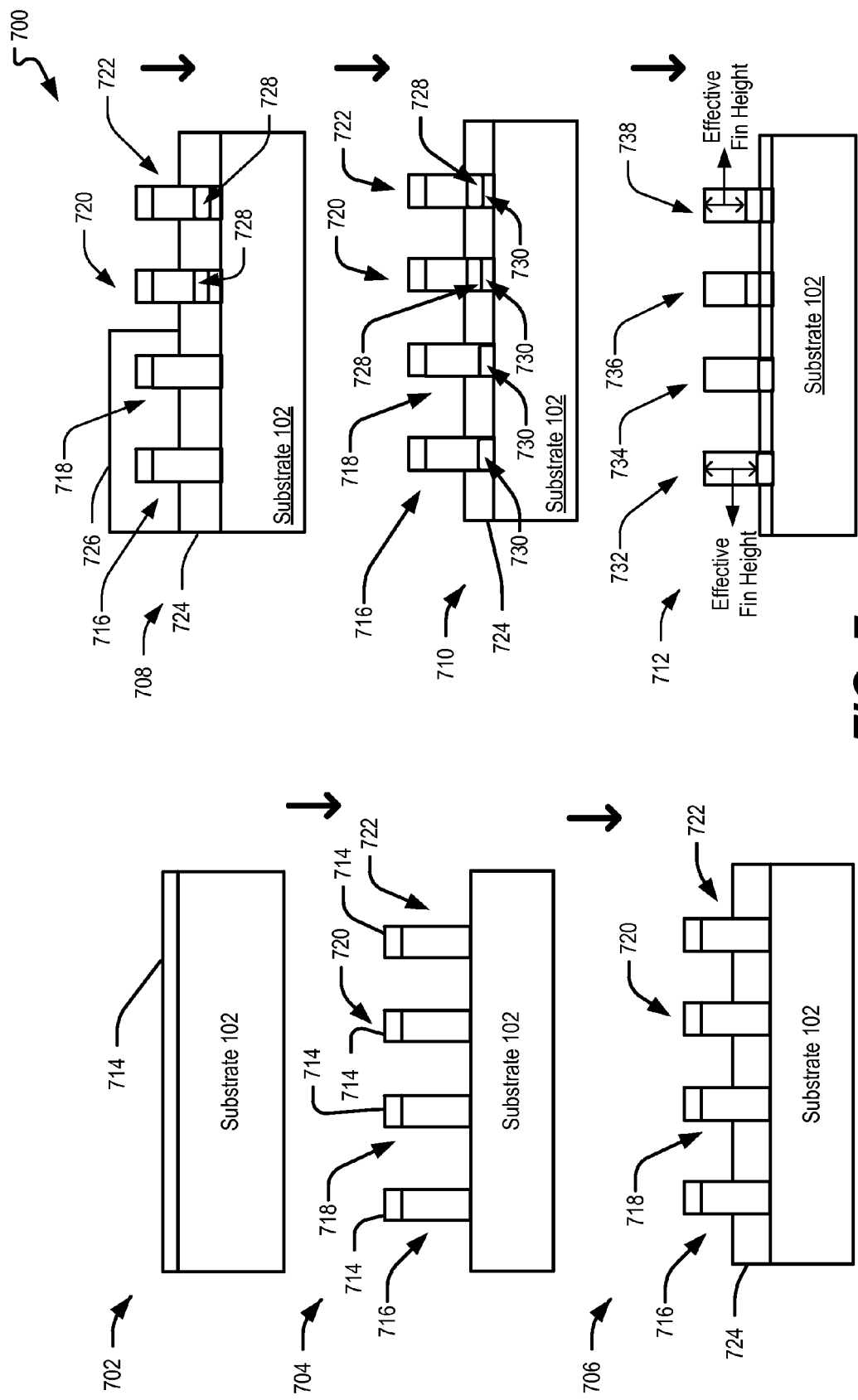
FIG. 7 is a diagram that illustrates another particular embodiment of a process to manufacture a fin-type semiconductor device that includes a FinFET with fins having different effective fin heights.

FIG. 7 illustrates another particular embodiment of a process 700 to manufacture a fin-type semiconductor device that includes a FinFET with fins having different effective fin heights. The process 700 may implant ion implants into a substrate after fin formation.

At a first processing stage 702, a STI oxide/SiN layer 714 may be formed on the surface of the substrate 102 of FIG. 1. At a second processing stage 704, a first particular fin 716, a second particular fin 718, a third particular fin 720, and a fourth particular fin 722 may be formed by etching away portions of the substrate 102 and portions of the STI oxide/SiN layer 714. Each particular fin 716-722 may include at least a remaining portion of the STI oxide/SiN layer 714 and at least a portion of the substrate 102. At a third processing stage 706, a STI oxide layer 724 may be formed on regions of the surface of the substrate 102 that are not occupied by the particular fins 716-722.

At a fourth processing stage 708, a photo resist mask 726 may be formed over the first particular fin 716 and the second particular fin 718. First ion implants 728 may be implanted into a region of the third particular fin 720 at a first depth by a low energy lateral scatter implant. The region may include the portion of the substrate 102. The first ion implants 728 may also be implanted into a region of the fourth particular fin 722 at the first depth. The region of the fourth particular fin 722 may include the portion of the substrate 102.

At a fifth processing stage 710, the photo resist mask 726 and a portion of the STI oxide layer 724 may be removed (e.g., using dry or wet etching). Second ion implants 730 may be implanted into each particular fin 716-722 at a second depth by a low energy lateral scatter implant. In a particular embodiment, the first ion implants 728 and/or the second ion implants are implanted via lateral scatter doping. The second depth may be different than the first depth. The second ion implants 730 may be implanted into the third particular fin 720 and the fourth particular fin 722 such that the second ion implants 730 overlap with the first ion implants 728. The first ion implants 728 and the second ion implants 730 may have the same doping concentration. The first ion implants 728 and the second ion implants 730 may have a different doping concentration than the substrate 102. In a particular embodiment, the first ion implants 728 and the second ion implants 730 are N-type dopants. In another particular embodiment, the first ion implants 728 and the second ion implants 730 are P-type dopants.

A region of the first particular fin 716 that includes the second ion implants 730 may be a first high doping region and a region of the first particular fin 716 that includes the portion of the substrate 102 may be a first low doping region. A region of the second particular fin 718 that includes the second ion implants 730 may be a second high doping region and a region of the second particular fin 718 that includes the portion of the substrate 102 may be a second low doping region. The first high doping region and the second high doping region may have a first height.

A region of the third particular fin 720 that includes the first ion implants 728 and the second ion implants 730 may be a third high doping region. A region of the third particular fin 720 that includes the portion of the substrate 102 may be a third low doping region. A region of the fourth particular fin 722 that includes the first ion implants 728 and the second ion implants 730 may be a fourth high doping region and a region of the fourth particular fin 722 that includes the portion of the substrate 102 may be a fourth low doping region. The third high doping region and the fourth high doping region may have a second height. The second height may be different than the first height.

At a sixth processing stage 712, a first particular FinFET 732 that includes the first particular fin 716, a second particular FinFET 734 that includes the second particular fin 718, a third particular FinFET 736 that includes the third particular fin 720, and a fourth particular FinFET 738 that includes the fourth particular fin 722 may be formed by etching away the remaining portion of STI oxide/SiN layer 714 and a portion of the STI oxide layer 724 and by adding a gate (not shown), a source (not shown), and a drain (not shown) to each particular fin 716-722 (e.g., via dielectric deposition, film deposition, photolithography, and etching). The first particular FinFET 732 and the second particular FinFET 734 may have the same effective fin height (as indicated by an arrow in FIG. 7) that corresponds to the first effective fin height 130 of FIG. 1. The third particular FinFET 736 and the fourth particular FinFET 738 may have the same effective fin height (as indicated by an arrow in FIG. 7) that corresponds to the second effective fin height 132 of FIG. 1. The first particular FinFET 732, the second particular FinFET 734, the third particular FinFET 736, the fourth particular FinFET 738, or any combination thereof may form a fin-type semiconductor device. The fin-type semiconductor device may be the fin-type semiconductor device 100 of FIG. 1.

Figure 8:
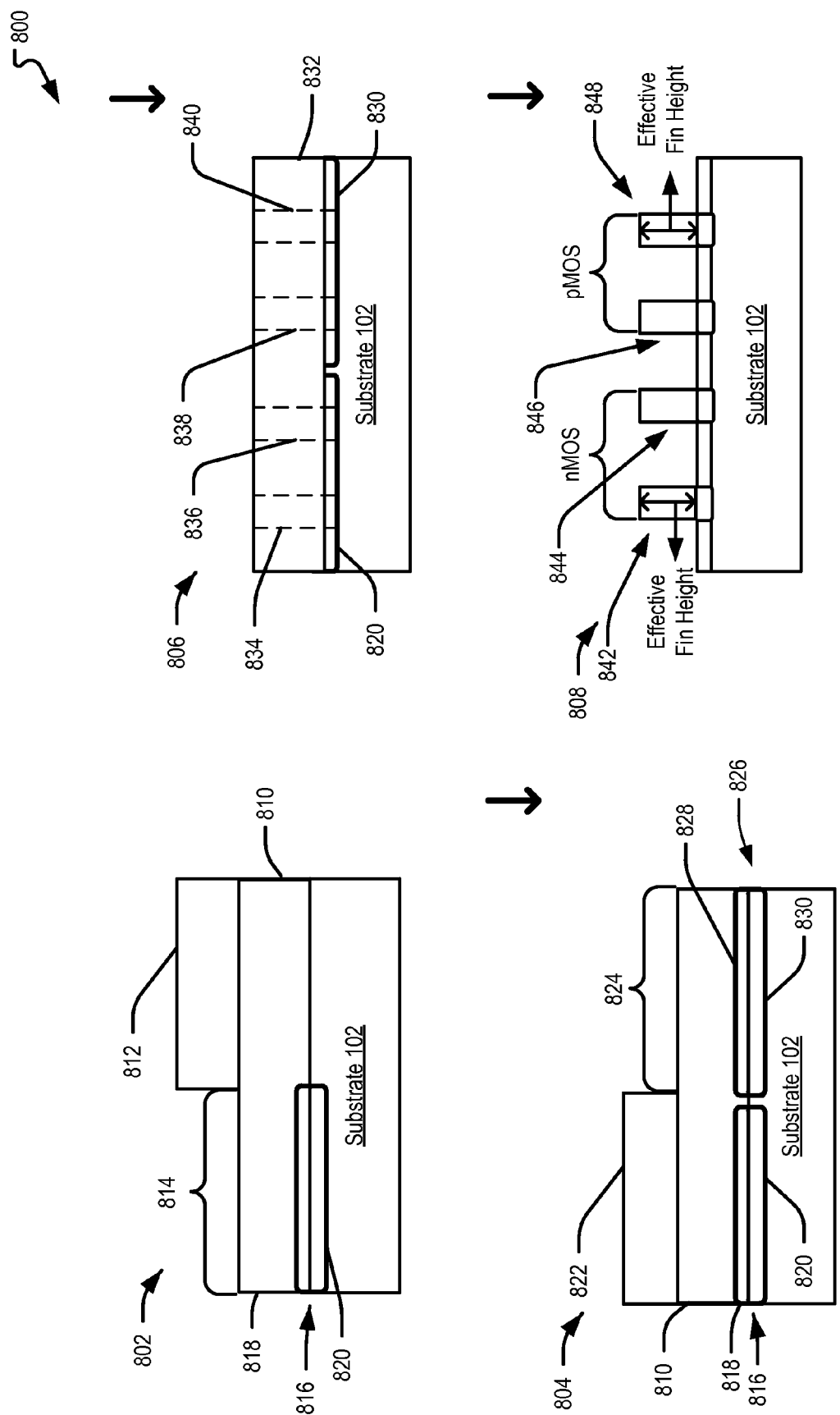
FIG. 8 is a diagram that illustrates a particular embodiment of a process to manufacture a complementary metal-oxide semiconductor (CMOS) device that includes a FinFET with fins having different effective fin heights.

FIG. 8 illustrates a particular embodiment of a process 800 to manufacture a complementary metal-oxide semiconductor (CMOS) device that includes a FinFET with fins having different effective fin heights. At a first processing stage 802, a pad oxide layer 810 may be formed on the surface of the substrate 102 of FIG. 1. A first photo resist mask 812 may be formed on the surface of the pad oxide layer 810 such that a first pass-through area 814 is exposed. N-type ion implants 816 may be implanted at a first depth through the first pass-through area 814. The N-type ion implants 816 may be implanted at the first depth such that at least one of the N-type ion implants 816 is implanted into a region 818 of the pad oxide layer 810 and at least one of the N-type ion implants 816 is implanted into a region 820 of the substrate 102.

At a second processing stage 804, the first photo resist mask 812 may be removed (e.g., using ashing and wet cleaning) and a second photo resist mask 822 may be formed on the surface of the pad oxide layer 810 such that a second pass-through area 824 is exposed. P-type ion implants 826 may be implanted at the first depth through the second pass-through area 824. The P-type ion implants 826 may be implanted at the first depth such that at least one of the P-type ion implants 826 is implanted into a region 828 of the pad oxide layer 810 and at least one of the P-type ion implants 826 is implanted into a region 830 of the substrate 102. In a particular embodiment, the P-type ion implants 826 may have a different doping concentration than the N-type ion implants 816. In another particular embodiment, the P-type ion implants 826 may have the same doping concentration than the N-type ion implants 816.

At a third processing stage 806, the second photo resist mask 822, the pad oxide layer 810 including the regions 818, 828 may be removed (e.g., using ashing, wet cleaning, and wet or dry etching) from the surface of the substrate 102. An epitaxial layer 832 may be formed on the surface of the substrate 102. The region 820 may have a different doping concentration than the epitaxial layer 832. The region 820 may have a different doping concentration than the epitaxial layer 832. The region 830 may have a different doping concentration than the epitaxial layer 832. A first particular fin 834, a second particular fin 836, a third particular fin 838, and a fourth particular fin 840 may be formed in a similar manner as described in the manufacturing process 600 of FIG. 6.

At a fourth processing stage 808, a first particular FinFET 842 that includes the first particular fin 834, a second particular FinFET 844 that includes the second particular fin 836, a third particular FinFET 846 that includes the third particular fin 838, and a fourth particular FinFET 848 that includes the fourth particular fin 840 may be formed in a similar manner as described in the manufacturing process 600 of FIG. 6. The first particular FinFET 842 and the second particular FinFET 844 may form a PMOS semiconductor device. The third particular FinFET 846 and the fourth particular FinFET 848 may form an NMOS semiconductor device. The NMOS semiconductor device and the PMOS semiconductor device may form a CMOS device.

Figure 9:
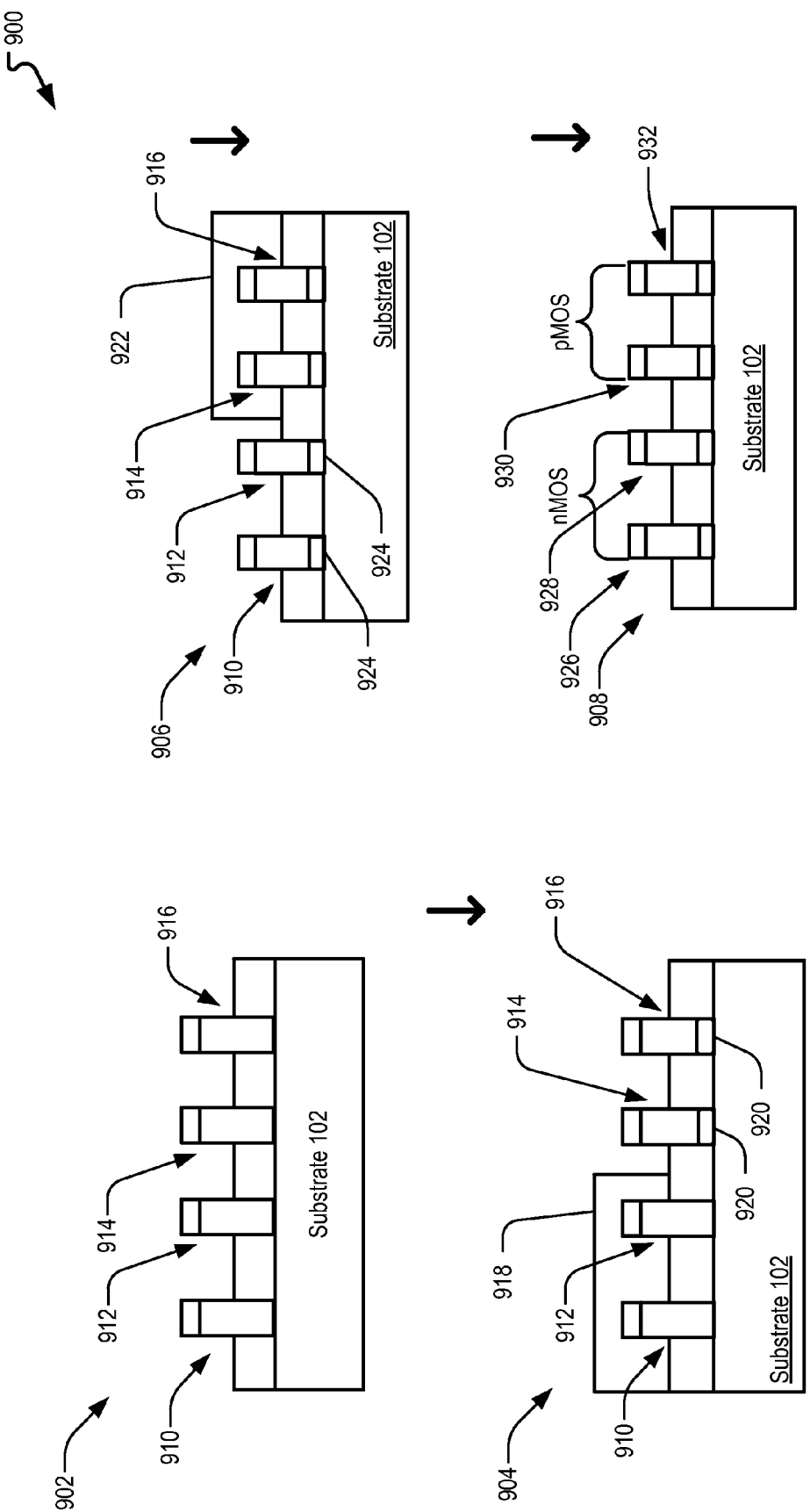
FIG. 9 is a diagram that illustrates another particular embodiment of a process to manufacture a CMOS device that includes a FinFET with fins having different effective fin heights.

FIG. 9 illustrates another particular embodiment of a process 900 to manufacture a CMOS device that includes a FinFET with fins having different effective fin heights. The process 900 may implant different types of ion implants into different fins.

At a first processing stage 902, a first particular fin 910, a second particular fin 912, a third particular fin 914, and a fourth particular fin 916 may be formed on the surface of the substrate 102 of FIG. 1 in a similar manner as described in the manufacturing process 700 of FIG. 7. At a second processing stage 904, a first photo resist mask 918 may be formed such that the third particular fin 914 and the fourth particular fin 916 are exposed. P-type ion implants 920 may be implanted (e.g., via low energy implant lateral scatter doping) into the third particular fin 914 and the fourth particular fin 916 at a first depth.

At a third processing stage 906, the first photo resist mask 918 may be removed (e.g., using ashing and wet cleaning). A second photo resist mask 922 may be formed such that the first particular fin 910 and the second particular fin 912 are exposed. N-type ion implants 924 may be implanted (e.g., via low energy implant lateral scatter doping) into the first particular fin 910 and the second particular fin 912 at the first depth. At a fourth processing stage 908, the second photo resist mask 922 may be removed (e.g., using ashing and a wet cleaning process). A first particular FinFET 926 that includes the first particular fin 910, a second particular FinFET 928 that includes the second particular fin 912, a third particular FinFET 930 that includes the third particular fin 914, and a fourth particular FinFET 932 that includes the fourth particular fin 916 may be formed in a similar manner as described in the manufacturing process 700 of FIG. 7. The first particular FinFET 926 and the second particular FinFET 928 may form a PMOS semiconductor device. The third particular FinFET 930 and the fourth particular FinFET 932 may form an NMOS semiconductor device. The NMOS semiconductor device and the PMOS semiconductor device may form a CMOS device.

FIG. 10 a flowchart illustrating a particular embodiment of a method 1000 of manufacturing of a fin-type semiconductor device that includes a FinFET with fins having different effective fin heights. The method 1000 includes forming a fin that extends from a substrate, at 1002. The fin comprises a first region having a first doping concentration and a second region having a second doping concentration. The first doping concentration is greater than the second doping concentration. For example, referring to FIG. 1, the first FinFET 104 may include a first fin 110 and a first gate 112. The first fin 110 may include a first region 114 and a second region 116. The first region 114 may have a higher doping concentration than the second region 116. In a particular embodiment, the method 1000 also includes forming a second fin that extends from the substrate, at 1004. The second fin comprises a third region having the first doping concentration and a fourth region having the second doping concentration. For example, referring to FIG. 1, the second fin 120 may include a third region 124 and a fourth region. The third region 124 and the first region 114 may have the same doping concentration. The fourth region 126 and the second region 116 may have the same doping concentration.

In a particular embodiment, the method 1000 further includes implanting first ion implants into the substrate at a first particular depth, at 1006. For example, referring to FIG. 2, the first ion implants 212 may be implanted into the substrate 102 at the first particular depth using the first implant energy level. In a particular embodiment, the method 1000 further includes implanting second ion implants into the substrate at a second particular depth, at 1008. The first particular depth is different than the second particular depth. The first region comprises at least one of the first ion implants. The third region comprises at least one of the second ion implants. For example, referring to FIG. 2, the second ion implants 216 may be implanted into the substrate 102 at the second particular depth using the second implant energy level. The first particular depth may be different than the second particular depth. At least one of the first ion implants 212 forms the first region 114 and at least one of the second ion implants 216 forms the third region 124.

In a particular embodiment, the method 1000 further includes Implant second ion implants into the substrate at a second particular depth, at 1010. The first region comprises at least one of the first ion implants and the third region comprises at least one of the first ion implants and at least one of the second ion implants. For example, referring to FIG. 6, the additional ion implants 626 may be implanted at the second depth such that at least one of the additional ion implants 626 is implanted into the region 628 of the second pad oxide layer 620 and at least one of the additional ion implants 626 is implanted into the region 630 of the first epitaxial layer 618. The first high doping region 642 may include the portion of the region 616 and the third high doping region 650 may include at least the portion of the region 616 and at least the portion of the region 630. In a particular embodiment, the method 1000 further includes forming an oxide layer on the substrate, at 1012. Prior to source and drain formation of a fin-type semiconductor device that includes the fin, a doping concentration of the oxide layer is less than the first doping concentration. For example, the STI oxide layer 108 may be formed on the substrate 102. Prior to source and drain formation of the fin-type semi-conductor device 100, the STI oxide layer 108 may have a doping concentration that is less than the first doping concentration ($10^{16} \sim 10^{18}/cm^3$).

Thus, the method 1000 may enable to a fin-type semiconductor device with a controllable effective fin height to be manufactured. A fin-type semiconductor device with a controllable effective fin height may provide a non-integer drive current ratio to suite a design parameter of a resulting semiconductor device.

FIG. 11 a flowchart illustrating a particular embodiment of a method 1100 of manufacturing of a fin-type semiconductor device that includes a FinFET with fins having different effective fin heights. The method 1100 includes forming a fin that extends from a substrate, at 1102. The fin comprises a first region having a first doping concentration and a second region having a second doping concentration. The first doping concentration is greater than the second doping concentration. For example, referring to FIG. 1, the first FinFET 104 may include a first fin 110 and a first gate 112. The first fin 110 may include a first region 114 and a second region 116. The first region 114 may have a higher doping concentration than the second region 116. In a particular embodiment, the method 1100 also includes forming a second fin that extends from the substrate, at 1104. The second fin comprises a third region having the first doping concentration and a fourth region having the second doping concentration. For example, referring to FIG. 1, the second fin 120 may include a third region 124 and a fourth region. The third region 124 and the first region 114 may have the same doping concentration. The fourth region 126 and the second region 116 may have the same doping concentration.

In a particular embodiment, the method 1100 further includes forming a pad oxide layer on the substrate, at 1106. For example, referring to FIG. 2, a pad oxide layer 206 may be formed on the surface of the substrate 102. In a particular embodiment, the method 1100 further includes removing a portion of the pad oxide layer to form a first oxide region and a second oxide region, at 1108. The first oxide region has a different height than the second oxide region. The first ion implants are implanted into the substrate through the first oxide region. The second ion implants are implanted into the substrate through the second oxide region. For example, referring to FIG. 3, after the pad oxide layer 206 of FIG. 2 is formed, the portion 306 of the pad oxide layer 206 may be removed (e.g., using wet or dry etching) to expose the first oxide region 308 that is thinner than the second oxide region 310. The first ion implants 212 may be implanted through the first oxide region 308 and into the substrate 102 of FIG. 1. The second ion implants 216 may be implanted through the second oxide region 310 and into the substrate 102.

In a particular embodiment, the method 1100 further includes forming an additional oxide layer on a particular region of the pad oxide layer to form a first oxide region and a second oxide region, at 1110. For example, referring to FIG. 4, the additional layer of pad oxide may be formed on the surface of the substrate 102 and over the pad oxide layer 206 such that the second pass-through region 412 has a greater height than the first pass-through region 410. In a particular embodiment, the method 1100 further includes forming an oxide layer on the substrate, at 1112. Prior to source and drain formation of a fin-type semiconductor device that includes the fin, a doping concentration of the oxide layer is less than the first doping concentration. For example, the STI oxide layer 108 may be formed on the substrate 102. Prior to source and drain formation of the fin-type semi-conductor device 100, the STI oxide layer 108 may have a doping concentration that is less than the first doping concentration ($10^{16} \sim 10^{18}/cm^3$).

Thus, the method 1100 may enable to a fin-type semiconductor device with a controllable effective fin height to be manufactured. A fin-type semiconductor device with a controllable effective fin height may provide a non-integer drive current ratio to suite a design parameter of a resulting semiconductor device.

FIG. 12 is a block diagram of a communication device 1200 that includes a FinFET (e.g., any of the FinFETs in FIGS. 1-9) with fins having different effective fin heights. The methods described in FIGS. 10-11, or certain portions thereof, may be performed at or by the communication device 1200, (or by components thereof).

The communication device 1200 includes a processor 1210, such as a digital signal processor (DSP), coupled to a memory 1232. The memory 1232 may be a non-transitory tangible computer-readable and/or processor-readable storage device that stores instructions 1246. The instructions 1246 may be executable by the processor 1210 to perform one or more functions or methods described herein, such as the methods described with reference to FIGS. 10-11.

FIG. 12 shows that the communication device 1200 may also include a display controller 1226 that is coupled to the processor 1210 and to a display device 1228. A coder/decoder (CODEC) 1234 can also be coupled to the processor 1210. A speaker 1236 and a microphone 1238 can be coupled to the CODEC 1234. FIG. 12 also shows a wireless controller 1240 coupled to the processor 1210. The wireless controller 1240 is in communication with an antenna 1242 via a transceiver 1250. The wireless controller 1240, the transceiver 1250, and the antenna 1242 may represent a wireless interface that enables wireless communication by the communication device 1200. The communication device 1200 may include numerous wireless interfaces, where different wireless networks are configured to support different networking technologies or combinations of networking technologies (e.g., Bluetooth low energy, Near-field communication, Wi-Fi, cellular, etc.).

In a particular embodiment, the processor 1210, the display controller 1226, the memory 1232, the CODEC 1234, the wireless controller 1240, and the transceiver 1250 are included in a system-in-package or system-on-chip device 1222. In a particular embodiment, an input device 1230 and a power supply 1244 are coupled to the system-on-chip device 1222. Moreover, in a particular embodiment, as illustrated in FIG. 12, the display device 1228, the input device 1230, the speaker 1236, the microphone 1238, the antenna 1242, and the power supply 1244 are external to the system-on-chip device 1222. However, each of the display device 1228, the input device 1230, the speaker 1236, the microphone 1238, the antenna 1242, and the power supply 1244 can be coupled to a component of the system-on-chip device 1222, such as an interface or a controller.

The processor 1210 may be implemented at least in part using a FinFET 1248 with a controllable effective fin height. The FinFET 1248 may be any of the FinFETs of FIGS. 1-9. The FinFET 1248 may be used in circuits of one or more components of the communication device 1200 to provide a non-integer current ratio.

Although the processor 1210 is described to be implemented at least in part using the FinFET 1248, it should be understood that any of the display controller 1226, the memory 1232, the CODEC 1234, the wireless controller 1240 may be implemented at least in part using the FinFET 1248.

In conjunction with the described embodiments, an apparatus is disclosed that may include a substrate and a fin-type semiconductor device extending from the substrate. The fin-type semiconductor device may include means for providing a fin-type conduction channel. The means for providing a fin-type conduction channel may include a first region having a first doping concentration and a second region having a second doping concentration. The first doping concentration is greater than the second doping concentration. For example, the means for providing a fin-type conduction channel may include the first fin 110 of FIG. 1, the second fin 120, any of the particular fins of FIGS. 5-9, one or more other devices configured to provide a fin-type conduction channel, or any combination thereof. The apparatus may also include means for shielding current leakage. For example, the means for shielding current leakage may include the STI oxide layer 108 of FIG. 1, one or more other devices configured to shield current leakage, or any combination thereof. Prior to source and drain formation of the fin-type semiconductor device, a doping concentration of the means for shielding current leakage is less than the first doping concentration. For example, prior to source and drain formation of the fin-type semiconductor device 100, the STI oxide layer 108 may have a doping concentration that is less than the first doping concentration ($10^{16}$~$10^{18}$/cm$^3$).

In a particular embodiment, the apparatus also includes second means for providing a fin-type conduction channel. For example, the second means for providing a fin-type conduction channel may include the first fin 110 of FIG. 1, the second fin 120, any of the particular fins of FIGS. 5-9, one or more other devices configured to provide a fin-type conduction channel, or any combination thereof.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 13 depicts a particular illustrative embodiment of an electronic device manufacturing process 1300.

Physical device information 1302 is received at the manufacturing process 1300, such as at a research computer 1306. The physical device information 1302 may include design information representing at least one physical property of a semiconductor device, such as the fin-type semiconductor device 100 of FIG. 1, the first fin 110, the second fin 120, the first FinFET 104, the second FinFET 106, any of the fins in FIGS. 2-9, any of the FinFETs in FIGS. 2-9, or any combination thereof. For example, the physical device information 1302 may include physical parameters, material characteristics, and structure information that is entered via a user interface 1304 coupled to the research computer 1306. The research computer 1306 includes a processor 1308, such as one or more processing cores, coupled to a computer readable medium such as a memory 1310. The memory 1310 may store computer readable instructions that are executable to cause the processor 1308 to transform the physical device information 1302 to comply with a file format and to generate a library file 1312.

In a particular embodiment, the library file 1312 includes at least one data file including the transformed design information. For example, the library file 1312 may include a library of semiconductor devices including a device that includes the fin-type semiconductor device 100 of FIG. 1, the first fin 110, the second fin 120, the first FinFET 104, the second FinFET 106, any of the fins in FIGS. 2-9, any of the FinFETs in FIGS. 2-9, or any combination thereof, that is provided for use with an electronic design automation (EDA) tool 1320.

The library file 1312 may be used in conjunction with the EDA tool 1320 at a design computer 1314 including a processor 1316, such as one or more processing cores, coupled to a memory 1318. The EDA tool 1320 may be stored as processor executable instructions at the memory 1318 to enable a user of the design computer 1314 to design a circuit including the fin-type semiconductor device 100 of FIG. 1, the first fin 110, the second fin 120, the first FinFET 104, the second FinFET 106, any of the fins in FIGS. 2-9, any of the FinFETs in FIGS. 2-9, or any combination thereof, of the library file 1312. For example, a user of the design computer 1314 may enter circuit design information 1322 via a user interface 1324 coupled to the design computer 1314. The circuit design information 1322 may include design information representing at least one physical property of a semiconductor device, such as the fin-type semiconductor device 100 of FIG. 1, the first fin 110, the second fin 120, the first FinFET 104, the second FinFET 106, any of the fins in FIGS. 2-9, any of the FinFETs in FIGS. 2-9, or any combination thereof. To illustrate, the circuit design property may include identification of particular circuits and relationships to other elements in a circuit design, positioning information, feature size information, interconnection information, or other information representing a physical property of a semiconductor device.

The design computer 1314 may be configured to transform the design information, including the circuit design information 1322, to comply with a file format. To illustrate, the file formation may include a database binary file format representing planar geometric shapes, text labels, and other information about a circuit layout in a hierarchical format, such as a Graphic Data System (GDSII) file format. The design computer 1314 may be configured to generate a data file including the transformed design information, such as a GDSII file 1326 that includes information describing the fin-type semiconductor device 100 of FIG. 1, the first fin 110, the second fin 120, the first FinFET 104, the second FinFET 106, any of the fins in FIGS. 2-9, any of the FinFETs in FIGS. 2-9, or any combination thereof, in addition to other circuits or information. To illustrate, the data file may include information corresponding to a system-on-chip (SOC) that includes the fin-type semiconductor device 100 of FIG. 1, the first fin 110, the second fin 120, the first FinFET 104, the second FinFET 106, any of the fins in FIGS. 2-9, any of the FinFETs in FIGS. 2-9, and that also includes additional electronic circuits and components within the SOC.

The GDSII file 1326 may be received at a fabrication process 1328 to manufacture the fin-type semiconductor device 100 of FIG. 1, the first fin 110, the second fin 120, the first FinFET 104, the second FinFET 106, any of the fins in FIGS. 2-9, any of the FinFETs in FIGS. 2-9, or any combination thereof, using transformed information in the GDSII file 1326. For example, a device manufacture process may include providing the GDSII file 1326 to a mask manufacturer 1330 to create one or more masks, such as masks to be used with photolithography processing, illustrated as a representative mask 1332. The representative mask 1332 may be used during the fabrication process to generate one or more wafers 1134, which may be tested and separated into dies, such as a representative die 1336. The representative die 1336 includes a circuit including a device that includes the fin-type semiconductor device 100 of FIG. 1, the first fin 110, the second fin 120, the first FinFET 104, the second FinFET 106, any of the fins in FIGS. 2-9, any of the FinFETs in FIGS. 2-9, or any combination thereof.

The representative die 1336 may be provided to a packaging process 1338 where the representative die 1336 is incorporated into a representative package 1340. For example, the package 1340 may include the die 1336 or multiple dies, such as a system-in-package (SiP) arrangement. The package 1340 may be configured to conform to one or more standards or specifications, such as Joint Electron Device Engineering Council (JEDEC) standards.

Information regarding the package 1340 may be distributed to various product designers, such as via a component library stored at a computer 1346. The computer 1346 may include a processor 1348, such as one or more processing cores, coupled to a memory 1350. A printed circuit board (PCB) tool may be stored as processor executable instructions at the memory 1350 to process PCB design information 1342 received from a user of the computer 1346 via a user interface 1344. The PCB design information 1342 may include physical positioning information of a packaged semiconductor device on a circuit board, the packaged semiconductor device corresponding to the package 1340 including the fin-type semiconductor device 100 of FIG. 1, the first fin 110, the second fin 120, the first FinFET 104, the second FinFET 106, any of the fins in FIGS. 2-9, any of the FinFETs in FIGS. 2-9, or any combination thereof.

The computer 1346 may be configured to transform the PCB design information 1342 to generate a data file, such as a GERBER file 1352 with data that includes physical positioning information of a packaged semiconductor device on a circuit board, as well as layout of electrical connections such as traces and vias, where the packaged semiconductor device corresponds to the package 1340 including the fin-type semiconductor device 100 of FIG. 1, the first fin 110, the second fin 120, the first FinFET 104, the second FinFET 106, any of the fins in FIGS. 2-9, any of the FinFETs in FIGS. 2-9, or any combination thereof. In other embodiments, the data file generated by the transformed PCB design information may have a format other than a GERBER format.

The GERBER file 1352 may be received at a board assembly process 1354 and used to create PCBs, such as a representative PCB 1356, manufactured in accordance with the design information stored within the GERBER file 1352. For example, the GERBER file 1352 may be uploaded to one or more machines to perform various steps of a PCB production process. The PCB 1356 may be populated with electronic components including the package 1340 to form a representative printed circuit assembly (PCA) 1358.

The PCA 1358 may be received at a product manufacture process 1360 and integrated into one or more electronic devices, such as a first representative electronic device 1362 and a second representative electronic device 1364. As an illustrative, non-limiting example, the first representative electronic device 1362, the second representative electronic device 1364, or both, may be selected from the group of a set top box, a music player, a video player, an entertainment unit, a navigation device, a communications device, a personal digital assistant (PDA), a fixed location data unit, and a computer, into which the fin-type semiconductor device 100 of FIG. 1, the first fin 110, the second fin 120, the first FinFET 104, the second FinFET 106, any of the fins in FIGS. 2-9, any of the FinFETs in FIGS. 2-9 is integrated. As another illustrative, non-limiting example, one or more of the electronic devices 1362 and 1364 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 13 illustrates remote units using teachings of the disclosure, the disclosure is not limited to these illustrated units. Embodiments of the disclosure may be suitably employed in any device which includes active integrated circuitry including memory and on-chip circuitry.

A device that includes the fin-type semiconductor device 100 of FIG. 1, the first fin 110, the second fin 120, the first FinFET 104, the second FinFET 106, any of the fins in FIGS. 2-9, any of the FinFETs in FIGS. 2-9, or any combination thereof, may be fabricated, processed, and incorporated into an electronic device, as described in the illustrative process 1300. One or more aspects of the embodiments disclosed with respect to FIGS. 1-9 may be included at various processing stages, such as within the library file 1312, the GDSII file 1326, and the GERBER file 1352, as well as stored at the memory 1310 of the research computer 1306, the memory 1318 of the design computer 1314, the memory 1350 of the computer 1346, the memory of one or more other computers or processors (not shown) used at the various stages, such as at the board assembly process 1354, and also incorporated into one or more other physical embodiments such as the representative mask 1332, the representative die 1336, the package 1340, the PCA 1358, other products such as prototype circuits or devices (not shown), or any combination thereof. Although various representative stages of production from a physical device design to a final product are depicted, in other embodiments fewer stages may be used or additional stages may be included. Similarly, the illustrative process 1300 may be performed by a single entity or by one or more entities performing various stages of the illustrative process 1300.

One or more of the disclosed embodiments may be implemented in a system or an apparatus that includes a portable music player, a personal digital assistant (PDA), a mobile location data unit, a mobile phone, a cellular phone, a computer, a tablet, a portable digital video player, or a portable computer. Additionally, the system or the apparatus may include a communications device, a fixed location data unit, a set top box, an entertainment unit, a navigation device, a monitor, a computer monitor, a television, a tuner, a radio, a satellite radio, a music player, a digital music player, a video player, a digital video player, a digital video disc (DVD) player, a desktop computer, any other device that stores or retrieves data or computer instructions, or a combination thereof. As another illustrative, non-limiting example, the system or the apparatus may include remote units, such as global positioning system (GPS) enabled devices, navigation devices, fixed location data units such as meter reading equipment, or any other device that stores or retrieves data or computer instructions, or any combination thereof. Although one or more of FIGS. 1-13 illustrate systems, apparatuses, and/or methods using the teachings of the disclosure, the disclosure is not limited to these illustrated systems, apparatuses, and/or methods. Embodiments of the disclosure may be suitably employed in any device that memory, a processor, and circuitry.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed or that the first element must precede the second element in some manner. Also, unless stated otherwise a set of elements may comprise one or more elements.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

Various illustrative components, blocks, configurations, modules, circuits, and steps have been described above generally in terms of their functionality. Whether such functionality is implemented as hardware or processor executable instructions depends upon the particular application and design constraints imposed on the overall system. Additionally, the various operations of methods described above (e.g., any operation illustrated in the FIGS. 1-13) may be performed by any suitable means capable of performing the operations, such as various hardware and/or software component(s), circuits, and/or module(s). Skilled artisans may implement the described functionality in varying ways for each particular application, but such implementation decisions should not be interpreted as causing a departure from the scope of the present disclosure.

Those of skill in the art would further appreciate that the various illustrative logical blocks, configurations, modules, circuits, and algorithm steps described in connection with the present disclosure may be implemented or performed with a general purpose processor, a digital signal processor (DSP), an application specific integrated circuit (ASIC), a field programmable gate array (FPGA), a programmable logic device (PLD), discrete gate or transistor logic, discrete hardware components (e.g., electronic hardware), computer software executed by a processor, or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented in hardware, software, firmware, or any combination thereof. If implemented in software, the functions may be stored as one or more instructions or code on a computer-readable medium. Computer-readable media includes computer readable storage media and communication media including any medium that facilitates transfer of computer program data from one place to another. A storage media may be any available media that can be accessed by a computer. By way of example, and not limitation, such computer readable storage media can include random access memory (RAM), read-only memory (ROM), programmable read-only memory (PROM), erasable PROM (EPROM), electrically erasable PROM (EEPROM), register(s), hard disk, a removable disk, a compact disc read-only memory (CD-ROM), other optical disk storage, magnetic disk storage, magnetic storage devices, or any other medium that can be used to store program code in the form of instructions or data and that can be accessed by a computer. In the alternative, the computer-readable media (e.g., a storage medium) may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and floppy disk where disks usually reproduce data magnetically, while discs reproduce data optically with lasers. Thus, in some aspects computer readable medium may include a non-transitory computer readable medium (e.g., tangible media). Combinations of the above should also be included within the scope of computer-readable media.

The methods disclosed herein include one or more steps or actions. The method steps and/or actions may be interchanged with one another without departing from the scope of the claims. In other words, unless a specific order of steps or actions is specified, the order and/or use of specific steps and/or actions may be modified without departing from the scope of the disclosure.

Certain aspects may include a computer program product for performing the operations presented herein. For example, a computer program product may include a computer-readable storage medium having instructions stored (and/or encoded) thereon, the instructions being executable by one or more processors to perform the operations described herein. The computer program product may include packaging material.

Further, it should be appreciated that modules and/or other appropriate means for performing the methods and techniques described herein can be downloaded and/or otherwise obtained by a user terminal and/or base station as applicable. Alternatively, various methods described herein can be provided via storage means (e.g., RAM, ROM, or a physical storage medium such as a compact disc (CD)). Moreover, any other suitable technique for providing the methods and techniques described herein can be utilized. It is to be understood that the scope of the disclosure is not limited to the precise configuration and components illustrated above.

The previous description of the disclosed embodiments is provided to enable a person skilled in the art to make or use the disclosed embodiments. While the foregoing is directed to aspects of the present disclosure, other aspects of the disclosure may be devised without departing from the basic scope thereof, and the scope is determined by the claims that follow. Various modifications, changes and variations may be made in the arrangement, operation, and details of the embodiments described herein without departing from the scope of the disclosure or the claims. Thus, the present disclosure is not intended to be limited to the embodiments herein but is to be accorded the widest scope possible consistent with the principles and novel features as defined by the following claims and equivalents thereof.

What is claimed is:

1. A method comprising:
receiving design information comprising physical positioning information of a packaged semiconductor device on a circuit board, the packaged semiconductor device comprising:
a substrate; and
a fin-type semiconductor device extending from the substrate, the fin-type semiconductor device comprising:
a first fin comprising a first region having a first doping concentration and a second region having a second doping concentration, wherein the first fin comprises first ion implants implanted into the substrate at a first depth and second ion implants implanted into the substrate at a second depth different than the first depth, wherein the first doping concentration is greater than the second doping concentration;
initiating formation of a second fin that extends from the substrate, wherein the second fin comprises a third region having a third doping concentration and a fourth region above the third region having a fourth doping concentration, wherein each of the first region and the third region comprises at least one of the first ion implants; and
an oxide layer coupled to at least one of the first region and the third region; and
transforming the design information to generate a data file.

2. The method of claim 1, wherein the first fin has a first effective height defined by a first distance from a top of the first fin to a first location within the first region, and wherein the second fin has a second effective height defined by a second distance from a top of the second fin to a second location within the third region.

3. The method of claim 1, wherein the data file has a GERBER format.

4. The method of claim 1, wherein the data file has a GDSII format.

5. An apparatus comprising a substrate and a fin-type semiconductor device extending from the substrate, the fin-type semiconductor device comprising:
means for providing a first fin-type conduction channel, the means for providing the first fin-type conduction channel comprising a first region having a first doping concentration and a second region having a second doping concentration, wherein the first fin-type conduction channel comprises first ion implants implanted into the substrate at a first depth and second ion implants implanted into the substrate at a second depth different from the first depth, and wherein the first doping concentration is greater than the second doping concentration;
means for providing a second fin-type conduction channel, the means for providing the second fin-type conduction channel comprising a third region having a third doping concentration and a fourth region above the third region having a fourth doping concentration, wherein each of the first region and the third region comprises at least one of the first ion implants; and
means for shielding current leakage, the means for shielding current leakage coupled to at least one of the first region and the third region.

6. The apparatus of claim 5, wherein the first fin-type conduction channel has a first effective height defined by a first distance from a top of the first fin-type conduction channel to a first location within the first region, and wherein the second fin-type conduction channel has a second effective height defined by a second distance from a top of the second fin-type conduction channel to a second location within the third region.

7. The apparatus of claim 5, further comprising a device selected from the group consisting of a set top box, a music player, a video player, an entertainment unit, a navigation device, a communications device, a personal digital assistant (PDA), a fixed location data unit, and a computer, into which the fin-type semiconductor device is integrated.

8. The apparatus of claim 5, wherein the first doping concentration is different than the third doping concentration.

9. The apparatus of claim 5, wherein the first region is doped using an N-type dopant, and wherein the third region is doped using a P-type dopant.

10. The apparatus of claim 5, wherein a drive current ratio between the first fin-type conduction channel and the second fin-type conduction channel is a non-integer number.

11. The apparatus of claim 5, wherein the first region is implanted into the first fin-type conduction channel using a first implant dose, and wherein the third region is implanted into the second fin-type conduction channel using a second implant dose.

12. The apparatus of claim 5, wherein the first region is formed subsequent to a formation of an outer shape of the first fin-type conduction channel.

13. The apparatus of claim 5, wherein the first region is formed via ion implantation, and wherein the second region is formed via epitaxy.

14. The apparatus of claim 5, wherein the first region is formed by ion implantation at the first depth using a first implant energy level, and wherein the third region is formed by ion implantation at the second depth using a second implant energy level.

15. The apparatus of claim 14, wherein the first implant energy level is different than the second implant energy level.

16. The apparatus of claim 14, wherein the first depth is controlled by a first height of a pad oxide layer, wherein the second depth is controlled by a second height of the pad oxide layer, wherein the first height is different than the second height, and wherein the first implant energy level is substantially the same as the second implant energy level.

17. A computer-readable storage medium storing instructions that are executable by a computer to perform operations comprising:
initiating formation of a first fin that extends from a substrate, wherein the first fin comprises a first region having a first doping concentration and a second region having a second doping concentration, wherein the first fin comprises first ion implants implanted into the substrate at a first depth and second ion implants implanted into the substrate at a second depth different than the first depth, and wherein the first doping concentration is greater than the second doping concentration;
initiating formation of a second fin that extends from the substrate, wherein the second fin comprises a third region having a third doping concentration and a fourth region above the third region having a fourth doping concentration, wherein each of the first region and the third region comprises at least one of the first ion implants; and
initiating formation of an oxide layer coupled to at least one of the first region and the third region.

18. The computer-readable storage medium of claim 17, wherein the first fin has a first effective height defined by a first distance from a top of the first fin to a first location within the first region, and wherein the second fin has a second effective height defined by a second distance from a top of the second fin to a second location within the third region.

19. The computer-readable storage medium of claim 17, wherein the first doping concentration is different than the third doping concentration.

20. The computer-readable storage medium of claim 17, wherein the first region is doped using an N-type dopant, and wherein the third region is doped using a P-type dopant.

* * * * *